(12) United States Patent
Amin-Shahidi et al.

(10) Patent No.: US 10,599,223 B1
(45) Date of Patent: Mar. 24, 2020

(54) BUTTON PROVIDING FORCE SENSING AND/OR HAPTIC OUTPUT

(71) Applicant: Apple Inc., Cupertino, CA (US)

(72) Inventors: Darya Amin-Shahidi, San Jose, CA (US); Alex M. Lee, Sunnyvale, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 16/146,384

(22) Filed: Sep. 28, 2018

(51) Int. Cl.
*G06F 3/01* (2006.01)
*G06F 3/046* (2006.01)
*G06F 3/044* (2006.01)

(52) U.S. Cl.
CPC .............. *G06F 3/016* (2013.01); *G06F 3/044* (2013.01); *G06F 3/046* (2013.01)

(58) Field of Classification Search
None
See application file for complete search history.

(56) References Cited

U.S. PATENT DOCUMENTS

| | | |
|---|---|---|
| 3,001,049 A | 9/1961 | Didier |
| 3,390,287 A | 6/1968 | Sonderegger |
| 3,419,739 A | 12/1968 | Clements |
| 4,236,132 A | 11/1980 | Zissimopoulos |
| 4,412,148 A | 10/1983 | Klicker et al. |
| 4,414,984 A | 11/1983 | Zarudiansky |
| 4,490,815 A | 12/1984 | Umehara et al. |
| 4,695,813 A | 9/1987 | Nobutoki et al. |
| 4,975,616 A | 12/1990 | Park |
| 5,010,772 A | 4/1991 | Bourland |
| 5,245,734 A | 9/1993 | Issartel |
| 5,283,408 A | 2/1994 | Chen |
| 5,293,161 A | 3/1994 | MacDonald et al. |
| 5,317,221 A | 5/1994 | Kubo et al. |
| 5,365,140 A | 11/1994 | Ohya et al. |
| 5,434,549 A | 7/1995 | Hirabayashi et al. |
| 5,436,622 A | 7/1995 | Gutman et al. |
| 5,510,584 A | 4/1996 | Norris |
| 5,510,783 A | 4/1996 | Findlater et al. |

(Continued)

FOREIGN PATENT DOCUMENTS

| | | |
|---|---|---|
| AU | 2015100710 | 7/2015 |
| AU | 2016100399 | 5/2016 |

(Continued)

OTHER PUBLICATIONS

U.S. Appl. No. 16/146,243, filed Sep. 28, 2018, Shahidi et al.

(Continued)

*Primary Examiner* — Joseph R Haley
(74) *Attorney, Agent, or Firm* — Brownstein Hyatt Farber Schreck, LLP

(57) ABSTRACT

A module includes a permanent magnet biased electromagnetic haptic engine, a constraint, and a force sensor. The force sensor includes a stator and a shuttle. The constraint is coupled to the stator and the shuttle. The force sensor is at least partially attached to the permanent magnet biased electromagnetic haptic engine and configured to sense a force applied to the module. The constraint is configured to constrain closure of a gap between the stator and the shuttle and bias the shuttle toward a rest position in which the shuttle is separated from the stator by the gap.

20 Claims, 25 Drawing Sheets

(56) References Cited

U.S. PATENT DOCUMENTS

| | | |
|---|---|---|
| 5,513,100 A | 4/1996 | Parker et al. |
| 5,587,875 A | 12/1996 | Sellers |
| 5,590,020 A | 12/1996 | Sellers |
| 5,602,715 A | 2/1997 | Lempicki et al. |
| 5,619,005 A | 4/1997 | Shibukawa et al. |
| 5,621,610 A | 4/1997 | Moore et al. |
| 5,625,532 A | 4/1997 | Sellers |
| 5,629,578 A | 5/1997 | Winzer et al. |
| 5,635,928 A | 6/1997 | Takagi et al. |
| 5,718,418 A | 2/1998 | Gugsch |
| 5,739,759 A | 4/1998 | Nakazawa et al. |
| 5,742,242 A | 4/1998 | Sellers |
| 5,783,765 A | 7/1998 | Muramatsu |
| 5,793,605 A | 8/1998 | Sellers |
| 5,812,116 A | 9/1998 | Malhi |
| 5,813,142 A | 9/1998 | Demon |
| 5,818,149 A | 10/1998 | Safari et al. |
| 5,896,076 A | 4/1999 | Van Namen |
| 5,907,199 A | 5/1999 | Miller |
| 5,951,908 A | 9/1999 | Cui et al. |
| 5,959,613 A | 9/1999 | Rosenberg et al. |
| 5,973,441 A | 10/1999 | Lo et al. |
| 5,982,304 A | 11/1999 | Selker et al. |
| 5,982,612 A | 11/1999 | Roylance |
| 5,995,026 A | 11/1999 | Sellers |
| 5,999,084 A | 12/1999 | Armstrong |
| 6,069,433 A | 5/2000 | Lazarus et al. |
| 6,078,308 A | 6/2000 | Rosenberg et al. |
| 6,127,756 A | 10/2000 | Iwaki |
| 6,135,886 A | 10/2000 | Armstrong |
| 6,184,868 B1 | 2/2001 | Shahoian et al. |
| 6,218,966 B1 | 4/2001 | Goodwin |
| 6,219,033 B1 | 4/2001 | Rosenberg |
| 6,220,550 B1 | 4/2001 | McKillip, Jr. |
| 6,222,525 B1 | 4/2001 | Armstrong |
| 6,252,336 B1 | 6/2001 | Hall |
| 6,342,880 B2 | 1/2002 | Rosenberg et al. |
| 6,351,205 B1 | 2/2002 | Armstrong |
| 6,373,465 B2 | 4/2002 | Jolly et al. |
| 6,408,187 B1 | 6/2002 | Merriam |
| 6,411,276 B1 | 6/2002 | Braun et al. |
| 6,429,849 B1 | 8/2002 | An |
| 6,438,393 B1 | 8/2002 | Surronen |
| 6,444,928 B2 | 9/2002 | Okamoto et al. |
| 6,455,973 B1 | 9/2002 | Ineson |
| 6,465,921 B1 | 10/2002 | Horng |
| 6,552,404 B1 | 4/2003 | Hynes |
| 6,552,471 B1 | 4/2003 | Chandran et al. |
| 6,557,072 B2 | 4/2003 | Osborn |
| 6,642,857 B1 | 11/2003 | Schediwy |
| 6,693,626 B1 | 2/2004 | Rosenberg |
| 6,717,573 B1 | 4/2004 | Shahoian et al. |
| 6,809,462 B2 | 10/2004 | Pelrine et al. |
| 6,809,727 B2 | 10/2004 | Piot et al. |
| 6,864,877 B2 | 3/2005 | Braun et al. |
| 6,906,697 B2 | 6/2005 | Rosenberg |
| 6,906,700 B1 | 6/2005 | Armstrong |
| 6,906,703 B2 | 6/2005 | Vablais et al. |
| 6,952,203 B2 | 10/2005 | Banerjee et al. |
| 6,954,657 B2 | 10/2005 | Bork et al. |
| 6,963,762 B2 | 11/2005 | Kaaresoja et al. |
| 6,995,752 B2 | 2/2006 | Lu |
| 7,005,811 B2 | 2/2006 | Wakuda et al. |
| 7,016,707 B2 | 3/2006 | Fujisawa et al. |
| 7,022,927 B2 | 4/2006 | Hsu |
| 7,023,112 B2 | 4/2006 | Miyamoto et al. |
| 7,081,701 B2 | 7/2006 | Yoon et al. |
| 7,091,948 B2 | 8/2006 | Chang et al. |
| 7,121,147 B2 | 10/2006 | Okada |
| 7,123,948 B2 | 10/2006 | Nielsen |
| 7,130,664 B1 | 10/2006 | Williams |
| 7,136,045 B2 | 11/2006 | Rosenberg et al. |
| 7,158,122 B2 * | 1/2007 | Roberts ............... G06F 3/0414 |
| | | 178/18.02 |
| 7,161,580 B2 | 1/2007 | Bailey et al. |
| 7,162,928 B2 | 1/2007 | Shank et al. |
| 7,170,498 B2 | 1/2007 | Huang |
| 7,176,906 B2 | 2/2007 | Williams et al. |
| 7,180,500 B2 | 2/2007 | Marvit et al. |
| 7,182,691 B1 | 2/2007 | Schena |
| 7,194,645 B2 | 3/2007 | Bieswanger et al. |
| 7,217,891 B2 | 5/2007 | Fischer et al. |
| 7,218,310 B2 | 5/2007 | Tierling et al. |
| 7,219,561 B2 | 5/2007 | Okada |
| 7,253,350 B2 | 8/2007 | Noro et al. |
| 7,269,484 B2 | 9/2007 | Hein |
| 7,333,604 B2 | 2/2008 | Zernovizky et al. |
| 7,334,350 B2 | 2/2008 | Ellis |
| 7,348,968 B2 | 3/2008 | Dawson |
| 7,388,741 B2 | 6/2008 | Konuma et al. |
| 7,392,066 B2 | 6/2008 | Hapamas |
| 7,423,631 B2 | 9/2008 | Shahoian et al. |
| 7,446,752 B2 | 11/2008 | Goldenberg et al. |
| 7,469,155 B2 | 12/2008 | Chu |
| 7,469,595 B2 | 12/2008 | Kessler et al. |
| 7,471,033 B2 | 12/2008 | Thiesen et al. |
| 7,495,358 B2 | 2/2009 | Kobayashi et al. |
| 7,508,382 B2 | 3/2009 | Denoue et al. |
| 7,561,142 B2 | 7/2009 | Shahoian et al. |
| 7,562,468 B2 | 7/2009 | Ellis |
| 7,569,086 B2 | 8/2009 | Chandran |
| 7,575,368 B2 | 8/2009 | Guillaume |
| 7,586,220 B2 | 9/2009 | Roberts |
| 7,619,498 B2 | 11/2009 | Miura |
| 7,639,232 B2 | 12/2009 | Grant et al. |
| 7,641,618 B2 | 1/2010 | Noda et al. |
| 7,649,305 B2 | 1/2010 | Priya et al. |
| 7,675,253 B2 | 3/2010 | Dorel |
| 7,675,414 B2 | 3/2010 | Ray |
| 7,679,611 B2 | 3/2010 | Schena |
| 7,707,742 B2 | 5/2010 | Ellis |
| 7,710,399 B2 | 5/2010 | Bruneau et al. |
| 7,732,951 B2 | 6/2010 | Mukaide |
| 7,737,828 B2 | 6/2010 | Yang et al. |
| 7,742,036 B2 | 6/2010 | Grant et al. |
| 7,788,032 B2 | 8/2010 | Moloney |
| 7,793,429 B2 | 9/2010 | Ellis |
| 7,793,430 B2 | 9/2010 | Ellis |
| 7,798,982 B2 | 9/2010 | Zets et al. |
| 7,868,489 B2 | 1/2011 | Amemiya et al. |
| 7,886,621 B2 | 2/2011 | Smith et al. |
| 7,888,892 B2 | 2/2011 | McReynolds et al. |
| 7,893,922 B2 | 2/2011 | Klinghult et al. |
| 7,919,945 B2 | 4/2011 | Houston et al. |
| 7,929,382 B2 | 4/2011 | Yamazaki |
| 7,946,483 B2 | 5/2011 | Miller et al. |
| 7,952,261 B2 | 5/2011 | Lipton et al. |
| 7,952,566 B2 | 5/2011 | Poupyrev et al. |
| 7,956,770 B2 | 6/2011 | Klinghult et al. |
| 7,961,909 B2 | 6/2011 | Mandella et al. |
| 8,018,105 B2 | 9/2011 | Erixon et al. |
| 8,031,172 B2 | 10/2011 | Kruse et al. |
| 8,044,940 B2 | 10/2011 | Narusawa |
| 8,069,881 B1 | 12/2011 | Cunha |
| 8,072,418 B2 | 12/2011 | Crawford et al. |
| 8,077,145 B2 | 12/2011 | Rosenberg et al. |
| 8,081,156 B2 | 12/2011 | Ruettiger |
| 8,082,640 B2 | 12/2011 | Takeda |
| 8,084,968 B2 | 12/2011 | Murray et al. |
| 8,098,234 B2 | 1/2012 | Lacroix et al. |
| 8,123,660 B2 | 2/2012 | Kruse et al. |
| 8,125,453 B2 | 2/2012 | Shahoian et al. |
| 8,141,276 B2 | 3/2012 | Ellis |
| 8,156,809 B2 | 4/2012 | Tierling et al. |
| 8,169,401 B2 | 5/2012 | Hardwick |
| 8,174,344 B2 | 5/2012 | Yakima et al. |
| 8,174,372 B2 | 5/2012 | da Costa |
| 8,179,202 B2 | 5/2012 | Cruz-Hernandez et al. |
| 8,188,623 B2 | 5/2012 | Park |
| 8,205,356 B2 | 6/2012 | Ellis |
| 8,210,942 B2 | 7/2012 | Shimabukuro et al. |
| 8,232,494 B2 | 7/2012 | Purcocks |
| 8,242,641 B2 | 8/2012 | Bae |
| 8,248,277 B2 | 8/2012 | Peterson et al. |

(56) References Cited

U.S. PATENT DOCUMENTS

| | | |
|---|---|---|
| 8,248,278 B2 | 8/2012 | Schlosser et al. |
| 8,253,686 B2 | 8/2012 | Kyung et al. |
| 8,255,004 B2 | 8/2012 | Huang et al. |
| 8,261,468 B2 | 9/2012 | Ellis |
| 8,264,465 B2 | 9/2012 | Grant et al. |
| 8,270,114 B2 | 9/2012 | Argumedo et al. |
| 8,270,148 B2 | 9/2012 | Griffith et al. |
| 8,288,899 B2 | 10/2012 | Park et al. |
| 8,291,614 B2 | 10/2012 | Ellis |
| 8,294,600 B2 | 10/2012 | Peterson et al. |
| 8,315,746 B2 | 11/2012 | Cox et al. |
| 8,344,834 B2 | 1/2013 | Niiyama |
| 8,378,797 B2 | 2/2013 | Pance et al. |
| 8,378,798 B2 | 2/2013 | Bells et al. |
| 8,378,965 B2 | 2/2013 | Gregorio et al. |
| 8,384,316 B2 | 2/2013 | Houston et al. |
| 8,384,679 B2 | 2/2013 | Paleczny et al. |
| 8,390,594 B2 | 3/2013 | Modarres et al. |
| 8,395,587 B2 | 3/2013 | Cauwels et al. |
| 8,398,570 B2 | 3/2013 | Mortimer et al. |
| 8,411,058 B2 | 4/2013 | Wong et al. |
| 8,446,264 B2 | 5/2013 | Tanase |
| 8,451,255 B2 | 5/2013 | Weber et al. |
| 8,461,951 B2 | 6/2013 | Gassmann et al. |
| 8,466,889 B2 | 6/2013 | Tong et al. |
| 8,471,690 B2 | 6/2013 | Hennig et al. |
| 8,487,759 B2 | 7/2013 | Hill |
| 8,515,398 B2 | 8/2013 | Song et al. |
| 8,542,134 B2 | 9/2013 | Peterson et al. |
| 8,545,322 B2 | 10/2013 | George et al. |
| 8,547,341 B2 | 10/2013 | Takashima et al. |
| 8,547,350 B2 | 10/2013 | Anglin et al. |
| 8,552,859 B2 | 10/2013 | Pakula et al. |
| 8,570,291 B2 | 10/2013 | Motomura |
| 8,575,794 B2 | 11/2013 | Lee et al. |
| 8,587,955 B2 | 11/2013 | DiFonzo et al. |
| 8,598,893 B2 | 12/2013 | Camus |
| 8,599,047 B2 | 12/2013 | Schlosser et al. |
| 8,599,152 B1 | 12/2013 | Wurtenberger et al. |
| 8,600,354 B2 | 12/2013 | Esaki |
| 8,614,431 B2 | 12/2013 | Huppi et al. |
| 8,621,348 B2 | 12/2013 | Ramsay et al. |
| 8,629,843 B2 | 1/2014 | Steeves et al. |
| 8,633,916 B2 | 1/2014 | Bernstein et al. |
| 8,674,941 B2 | 3/2014 | Casparian et al. |
| 8,680,723 B2 | 3/2014 | Subramanian |
| 8,681,092 B2 | 3/2014 | Harada et al. |
| 8,682,396 B2 | 3/2014 | Yang et al. |
| 8,686,952 B2 | 4/2014 | Burrough et al. |
| 8,710,966 B2 | 4/2014 | Hill |
| 8,717,309 B2 | 5/2014 | Almalki |
| 8,723,813 B2 | 5/2014 | Park et al. |
| 8,735,755 B2 | 5/2014 | Peterson et al. |
| 8,760,273 B2 | 6/2014 | Casparian et al. |
| 8,780,060 B2 | 7/2014 | Maschmeyer et al. |
| 8,787,006 B2 | 7/2014 | Golko et al. |
| 8,797,152 B2 | 8/2014 | Henderson et al. |
| 8,798,534 B2 | 8/2014 | Rodriguez et al. |
| 8,803,842 B2 | 8/2014 | Wakasugi et al. |
| 8,836,502 B2 | 9/2014 | Culbert et al. |
| 8,857,248 B2 | 10/2014 | Shih et al. |
| 8,860,562 B2 | 10/2014 | Hill |
| 8,861,776 B2 | 10/2014 | Lastrucci |
| 8,866,600 B2 | 10/2014 | Yang et al. |
| 8,890,668 B2 | 11/2014 | Pance et al. |
| 8,918,215 B2 | 12/2014 | Bosscher et al. |
| 8,928,621 B2 | 1/2015 | Ciesla et al. |
| 8,947,383 B2 | 2/2015 | Ciesla et al. |
| 8,948,821 B2 | 2/2015 | Newham et al. |
| 8,952,937 B2 | 2/2015 | Shih et al. |
| 8,970,534 B2 | 3/2015 | Adachi et al. |
| 8,976,141 B2 | 3/2015 | Myers et al. |
| 9,008,730 B2 | 4/2015 | Kim et al. |
| 9,012,795 B2 | 4/2015 | Niu |
| 9,013,426 B2 | 4/2015 | Cole et al. |
| 9,019,088 B2 | 4/2015 | Zawacki et al. |
| 9,024,738 B2 | 5/2015 | Van Schyndel et al. |
| 9,035,887 B1 | 5/2015 | Prud'Hommeaux et al. |
| 9,072,576 B2 | 7/2015 | Nishiura |
| 9,083,821 B2 | 7/2015 | Hughes |
| 9,092,129 B2 | 7/2015 | Abdo et al. |
| 9,098,991 B2 | 8/2015 | Park et al. |
| 9,117,347 B2 | 8/2015 | Matthews |
| 9,122,325 B2 | 9/2015 | Peshkin et al. |
| 9,131,039 B2 | 9/2015 | Behles |
| 9,134,834 B2 | 9/2015 | Reshef |
| 9,141,225 B2 | 9/2015 | Cok et al. |
| 9,158,379 B2 | 10/2015 | Cruz-Hernandez et al. |
| 9,178,509 B2 | 11/2015 | Bernstein |
| 9,189,932 B2 | 11/2015 | Kerdemelidis et al. |
| 9,201,458 B2 | 12/2015 | Hunt et al. |
| 9,202,355 B2 | 12/2015 | Hill |
| 9,213,409 B2 | 12/2015 | Redelsheimer et al. |
| 9,235,267 B2 | 1/2016 | Pope et al. |
| 9,274,601 B2 | 3/2016 | Faubert et al. |
| 9,274,602 B2 | 3/2016 | Garg et al. |
| 9,274,603 B2 | 3/2016 | Modarres et al. |
| 9,275,815 B2 | 3/2016 | Hoffmann |
| 9,285,923 B2 | 3/2016 | Liao et al. |
| 9,293,054 B2 | 3/2016 | Bruni et al. |
| 9,300,181 B2 | 3/2016 | Maeda et al. |
| 9,310,906 B2 | 4/2016 | Yumiki et al. |
| 9,310,950 B2 | 4/2016 | Takano et al. |
| 9,317,116 B2 | 4/2016 | Ullrich et al. |
| 9,317,118 B2 | 4/2016 | Puskarich |
| 9,317,154 B2 | 4/2016 | Perlin et al. |
| 9,318,942 B2 | 4/2016 | Sugita et al. |
| 9,325,230 B2 | 4/2016 | Yamada et al. |
| 9,357,052 B2 | 5/2016 | Ullrich |
| 9,360,944 B2 | 6/2016 | Pinault |
| 9,367,238 B2 | 6/2016 | Tanada |
| 9,380,145 B2 | 6/2016 | Tartz et al. |
| 9,390,599 B2 | 7/2016 | Weinberg |
| 9,396,434 B2 | 7/2016 | Rothkopf |
| 9,405,369 B2 | 8/2016 | Modarres et al. |
| 9,411,423 B2 | 8/2016 | Heubel |
| 9,417,695 B2 | 8/2016 | Griffin et al. |
| 9,430,042 B2 | 8/2016 | Levin |
| 9,448,713 B2 | 9/2016 | Cruz-Hernandez et al. |
| 9,449,476 B2 | 9/2016 | Lynn |
| 9,454,239 B2 | 9/2016 | Elias et al. |
| 9,467,033 B2 | 10/2016 | Jun et al. |
| 9,468,846 B2 | 10/2016 | Terrell et al. |
| 9,471,172 B2 | 10/2016 | Sirois |
| 9,477,342 B2 | 10/2016 | Daverman et al. |
| 9,480,947 B2 | 11/2016 | Jiang et al. |
| 9,501,912 B1 | 11/2016 | Hayskjold et al. |
| 9,542,028 B2 | 1/2017 | Filiz et al. |
| 9,544,694 B2 | 1/2017 | Abe et al. |
| 9,564,029 B2 | 2/2017 | Morrell et al. |
| 9,576,445 B2 | 2/2017 | Cruz-Hernandez |
| 9,608,506 B2 | 3/2017 | Degner et al. |
| 9,622,214 B2 | 4/2017 | Ryu |
| 9,640,048 B2 | 5/2017 | Hill |
| 9,652,040 B2 | 5/2017 | Martinez et al. |
| 9,659,482 B2 | 5/2017 | Yang et al. |
| 9,665,198 B2 | 5/2017 | Kies et al. |
| 9,692,286 B2 | 6/2017 | Endo et al. |
| 9,594,450 B2 | 7/2017 | Lynn et al. |
| 9,696,803 B2 | 7/2017 | Curz-Hernandez et al. |
| 9,710,061 B2 | 7/2017 | Pance et al. |
| 9,727,157 B2 | 8/2017 | Ham et al. |
| 9,733,704 B2 | 8/2017 | Cruz-Hernandez et al. |
| 9,746,945 B2 | 8/2017 | Sheynblat et al. |
| 9,778,743 B2 | 10/2017 | Grant et al. |
| 9,779,592 B1 | 10/2017 | Hoen |
| 9,785,251 B2 | 10/2017 | Martisauskas |
| 9,823,833 B2 | 11/2017 | Grant et al. |
| 9,830,782 B2 | 11/2017 | Morrell et al. |
| 9,831,871 B2 | 11/2017 | Lee et al. |
| 9,836,123 B2 | 12/2017 | Gipson et al. |
| 9,846,484 B2 | 12/2017 | Shah |
| 9,857,872 B2 | 1/2018 | Terlizzi et al. |
| 9,870,053 B2 | 1/2018 | Modarres et al. |

(56) References Cited

U.S. PATENT DOCUMENTS

| | | | |
|---|---|---|---|
| 9,886,093 | B2 | 2/2018 | Moussette et al. |
| 9,891,708 | B2 | 2/2018 | Cruz-Hernandez et al. |
| 9,904,393 | B2 | 2/2018 | Frey et al. |
| 9,911,553 | B2 | 3/2018 | Bernstein |
| 9,928,950 | B2 * | 3/2018 | Lubinski ............... H01F 7/12 |
| 9,934,661 | B2 | 4/2018 | Hill |
| 9,970,757 | B2 | 5/2018 | Das et al. |
| 9,990,099 | B2 | 6/2018 | Ham et al. |
| 9,997,306 | B2 | 6/2018 | Bernstein |
| 10,013,058 | B2 | 7/2018 | Puskarich et al. |
| 10,038,361 | B2 | 7/2018 | Hajati et al. |
| 10,039,080 | B2 | 7/2018 | Miller et al. |
| 10,067,585 | B2 | 9/2018 | Kim |
| 10,069,392 | B2 | 9/2018 | Degner et al. |
| 10,120,446 | B2 | 11/2018 | Pance et al. |
| 10,126,817 | B2 | 11/2018 | Morrell et al. |
| 10,127,778 | B2 | 11/2018 | Hajati et al. |
| 10,133,352 | B2 | 11/2018 | Lee et al. |
| 10,139,907 | B2 | 11/2018 | Billington |
| 10,139,959 | B2 | 11/2018 | Butler et al. |
| 10,146,309 | B2 | 12/2018 | Tissot et al. |
| 10,152,116 | B2 | 12/2018 | Wang et al. |
| 10,198,097 | B2 | 2/2019 | Lynn et al. |
| 10,236,760 | B2 | 3/2019 | Moussette et al. |
| 10,268,272 | B2 | 4/2019 | Chen |
| 10,276,001 | B2 | 4/2019 | Smith et al. |
| 2002/0194284 | A1 | 12/2002 | Haynes |
| 2003/0210259 | A1 | 11/2003 | Liu |
| 2004/0021663 | A1 | 2/2004 | Suzuki et al. |
| 2004/0127198 | A1 | 7/2004 | Roskind et al. |
| 2005/0057528 | A1 | 3/2005 | Kleen |
| 2005/0107129 | A1 | 5/2005 | Kaewell et al. |
| 2005/0110778 | A1 | 5/2005 | Ben Ayed |
| 2005/0118922 | A1 | 6/2005 | Endo |
| 2005/0217142 | A1 | 10/2005 | Ellis |
| 2005/0237306 | A1 | 10/2005 | Klein et al. |
| 2005/0248549 | A1 | 11/2005 | Dietz et al. |
| 2005/0258715 | A1 | 11/2005 | Schlabach |
| 2006/0014569 | A1 | 1/2006 | DelGiorno |
| 2006/0154674 | A1 | 7/2006 | Landschaft et al. |
| 2006/0209037 | A1 | 9/2006 | Wang et al. |
| 2006/0239746 | A1 | 10/2006 | Grant |
| 2006/0252463 | A1 | 11/2006 | Liao |
| 2007/0043725 | A1 | 2/2007 | Hotelling et al. |
| 2007/0099574 | A1 | 5/2007 | Wang |
| 2007/0152974 | A1 | 7/2007 | Kim et al. |
| 2007/0168430 | A1 | 7/2007 | Brun et al. |
| 2007/0178942 | A1 | 8/2007 | Sadler et al. |
| 2007/0188450 | A1 | 8/2007 | Hernandez et al. |
| 2008/0084384 | A1 | 4/2008 | Gregorio et al. |
| 2008/0165148 | A1 | 7/2008 | Williamson |
| 2008/0181501 | A1 | 7/2008 | Faraboschi |
| 2008/0181706 | A1 | 7/2008 | Jackson |
| 2008/0192014 | A1 | 8/2008 | Kent et al. |
| 2008/0204428 | A1 | 8/2008 | Pierce et al. |
| 2008/0255794 | A1 | 10/2008 | Levine |
| 2009/0002328 | A1 | 1/2009 | Ullrich et al. |
| 2009/0115734 | A1 | 5/2009 | Fredriksson et al. |
| 2009/0120105 | A1 | 5/2009 | Ramsay et al. |
| 2009/0128503 | A1 | 5/2009 | Grant et al. |
| 2009/0135142 | A1 | 5/2009 | Fu et al. |
| 2009/0167702 | A1 | 7/2009 | Nurmi |
| 2009/0218148 | A1 | 9/2009 | Hugeback et al. |
| 2009/0225046 | A1 | 9/2009 | Kim et al. |
| 2009/0236210 | A1 | 9/2009 | Clark et al. |
| 2009/0267892 | A1 | 10/2009 | Faubert |
| 2009/0291670 | A1 | 11/2009 | Sennett et al. |
| 2010/0020036 | A1 | 1/2010 | Hui et al. |
| 2010/0053087 | A1 | 3/2010 | Dai et al. |
| 2010/0079264 | A1 | 4/2010 | Hoellwarth |
| 2010/0089735 | A1 | 4/2010 | Takeda et al. |
| 2010/0141408 | A1 | 6/2010 | Doy et al. |
| 2010/0141606 | A1 | 6/2010 | Bae et al. |
| 2010/0148944 | A1 | 6/2010 | Kim et al. |
| 2010/0152620 | A1 | 6/2010 | Ramsay et al. |
| 2010/0164894 | A1 | 7/2010 | Kim et al. |
| 2010/0188422 | A1 | 7/2010 | Shingai et al. |
| 2010/0231508 | A1 | 9/2010 | Cruz-Hernandez et al. |
| 2010/0265197 | A1 | 10/2010 | Purdy |
| 2010/0328229 | A1 | 12/2010 | Weber et al. |
| 2011/0007023 | A1 | 1/2011 | Abrahamsson et al. |
| 2011/0053577 | A1 | 3/2011 | Lee et al. |
| 2011/0107958 | A1 | 5/2011 | Pance et al. |
| 2011/0121765 | A1 | 5/2011 | Anderson et al. |
| 2011/0128239 | A1 | 6/2011 | Polyakov et al. |
| 2011/0148608 | A1 | 6/2011 | Grant et al. |
| 2011/0157052 | A1 | 6/2011 | Lee et al. |
| 2011/0163985 | A1 | 7/2011 | Bae et al. |
| 2011/0248948 | A1 | 10/2011 | Griffin et al. |
| 2011/0260988 | A1 | 10/2011 | Colgate et al. |
| 2011/0263200 | A1 | 10/2011 | Thornton et al. |
| 2011/0291950 | A1 | 12/2011 | Tong |
| 2011/0304559 | A1 | 12/2011 | Pasquero |
| 2012/0075198 | A1 | 3/2012 | Sulem et al. |
| 2012/0092263 | A1 | 4/2012 | Peterson et al. |
| 2012/0126959 | A1 | 5/2012 | Zarrabi et al. |
| 2012/0133494 | A1 | 5/2012 | Cruz-Hernandez et al. |
| 2012/0139844 | A1 | 6/2012 | Ramstein et al. |
| 2012/0206248 | A1 | 8/2012 | Biggs |
| 2012/0256848 | A1 | 10/2012 | Srinivasan |
| 2012/0274578 | A1 | 11/2012 | Snow et al. |
| 2012/0280927 | A1 | 11/2012 | Ludwig |
| 2012/0319987 | A1 | 12/2012 | Woo |
| 2012/0327006 | A1 | 12/2012 | Israr et al. |
| 2013/0027345 | A1 | 1/2013 | Binzel |
| 2013/0033967 | A1 | 2/2013 | Chuang et al. |
| 2013/0058816 | A1 | 3/2013 | Kim |
| 2013/0106699 | A1 | 5/2013 | Babatunde |
| 2013/0191741 | A1 | 7/2013 | Dickinson et al. |
| 2013/0207793 | A1 | 8/2013 | Weaber et al. |
| 2013/0217491 | A1 | 8/2013 | Hilbert et al. |
| 2013/0228023 | A1 | 9/2013 | Drasnin et al. |
| 2013/0261811 | A1 | 10/2013 | Yagi et al. |
| 2013/0300590 | A1 | 11/2013 | Dietz et al. |
| 2014/0082490 | A1 | 3/2014 | Jung et al. |
| 2014/0085065 | A1 | 3/2014 | Biggs et al. |
| 2014/0143785 | A1 | 5/2014 | Mistry et al. |
| 2014/0168153 | A1 | 6/2014 | Deichmann et al. |
| 2014/0197936 | A1 | 7/2014 | Biggs et al. |
| 2014/0232534 | A1 | 8/2014 | Birnbaum et al. |
| 2014/0267076 | A1 | 9/2014 | Birnbaum et al. |
| 2015/0005039 | A1 | 1/2015 | Liu et al. |
| 2015/0040005 | A1 | 2/2015 | Faaborg |
| 2015/0098309 | A1 | 4/2015 | Adams et al. |
| 2015/0169059 | A1 | 6/2015 | Behles et al. |
| 2015/0194165 | A1 | 7/2015 | Faaborg et al. |
| 2015/0296480 | A1 | 10/2015 | Kinsey et al. |
| 2016/0103544 | A1 | 4/2016 | Filiz et al. |
| 2016/0206921 | A1 | 7/2016 | Szabados et al. |
| 2016/0216766 | A1 | 7/2016 | Puskarich |
| 2016/0241119 | A1 | 8/2016 | Keeler |
| 2016/0259480 | A1 | 9/2016 | Augenbergs et al. |
| 2016/0306423 | A1 | 10/2016 | Uttermann et al. |
| 2017/0038905 | A1 | 2/2017 | Bijamov et al. |
| 2017/0070131 | A1 | 3/2017 | Degner et al. |
| 2017/0090667 | A1 | 3/2017 | Abdollahian et al. |
| 2017/0192508 | A1 | 7/2017 | Lim et al. |
| 2017/0242541 | A1 | 8/2017 | Iuchi et al. |
| 2017/0255295 | A1 | 9/2017 | Tanemura et al. |
| 2017/0311282 | A1 | 10/2017 | Miller et al. |
| 2017/0357325 | A1 | 12/2017 | Yang et al. |
| 2017/0364158 | A1 | 12/2017 | Wen et al. |
| 2018/0052550 | A1 | 2/2018 | Zhang et al. |
| 2018/0060941 | A1 | 3/2018 | Yang et al. |
| 2018/0075715 | A1 | 3/2018 | Morrell et al. |
| 2018/0081441 | A1 | 3/2018 | Pedder et al. |
| 2018/0174409 | A1 | 6/2018 | Hill |
| 2018/0194229 | A1 * | 7/2018 | Wachinger ............... G06F 3/016 |
| 2018/0203513 | A1 | 7/2018 | Rihn |
| 2018/0302881 | A1 | 10/2018 | Miller et al. |
| 2018/0365466 | A1 * | 12/2018 | Shim ............... G06F 3/0421 |
| 2018/0369865 | A1 * | 12/2018 | Shoji ............... H04M 19/04 |

(56) References Cited

U.S. PATENT DOCUMENTS

2019/0094967 A1 3/2019 Brisbee
2019/0159170 A1 5/2019 Miller et al.

FOREIGN PATENT DOCUMENTS

| | | |
|---|---|---|
| CA | 2355434 | 2/2002 |
| CN | 1324030 | 11/2001 |
| CN | 1692371 | 11/2005 |
| CN | 1817321 | 8/2006 |
| CN | 101120290 | 2/2008 |
| CN | 101409164 | 4/2009 |
| CN | 101763192 | 6/2010 |
| CN | 101903848 | 12/2010 |
| CN | 101938207 | 1/2011 |
| CN | 102025257 | 4/2011 |
| CN | 201829004 | 5/2011 |
| CN | 102163076 | 8/2011 |
| CN | 102246122 | 11/2011 |
| CN | 102315747 | 1/2012 |
| CN | 102576252 | 7/2012 |
| CN | 102591512 | 7/2012 |
| CN | 102667681 | 9/2012 |
| CN | 102713805 | 10/2012 |
| CN | 102768593 | 11/2012 |
| CN | 102844972 | 12/2012 |
| CN | 102915111 | 2/2013 |
| CN | 103019569 | 4/2013 |
| CN | 103154867 | 6/2013 |
| CN | 103181090 | 6/2013 |
| CN | 103218104 | 7/2013 |
| CN | 103278173 | 9/2013 |
| CN | 103416043 | 11/2013 |
| CN | 103440076 | 12/2013 |
| CN | 103567135 | 2/2014 |
| CN | 103970339 | 8/2014 |
| CN | 104220963 | 12/2014 |
| CN | 104956244 | 9/2015 |
| CN | 105556268 | 5/2016 |
| DE | 19517630 | 11/1996 |
| DE | 10330024 | 1/2005 |
| DE | 102009038103 | 2/2011 |
| DE | 102011115762 | 4/2013 |
| EP | 0483955 | 5/1992 |
| EP | 1047258 | 10/2000 |
| EP | 1686776 | 8/2006 |
| EP | 2060967 | 5/2009 |
| EP | 2073099 | 6/2009 |
| EP | 2194444 | 6/2010 |
| EP | 2264562 A2 | 12/2010 |
| EP | 2315186 | 4/2011 |
| EP | 2374430 | 10/2011 |
| EP | 2395414 | 12/2011 |
| EP | 2461228 | 6/2012 |
| EP | 2631746 | 8/2013 |
| EP | 2434555 | 10/2013 |
| JP | H05301342 A2 | 11/1993 |
| JP | 2002199689 | 7/2002 |
| JP | 2002102799 | 9/2002 |
| JP | 200362525 | 3/2003 |
| JP | 2003527046 | 9/2003 |
| JP | 200494389 | 3/2004 |
| JP | 2004236202 | 8/2004 |
| JP | 2006150865 | 6/2006 |
| JP | 2007519099 | 7/2007 |
| JP | 2010272903 | 12/2010 |
| JP | 2012135755 | 7/2012 |
| JP | 2014002729 | 1/2014 |
| JP | 2014509028 | 4/2014 |
| JP | 2014235133 | 12/2014 |
| JP | 2015502456 | 7/2015 |
| JP | 2016095552 | 5/2016 |
| KR | 20050033909 | 4/2005 |
| KR | 1020100046602 | 5/2010 |
| KR | 1020110101516 | 9/2011 |
| KR | 20130024420 | 3/2013 |
| TW | 200518000 | 11/2007 |
| TW | 200951944 | 12/2009 |
| TW | 201145336 | 12/2011 |
| TW | 201218039 | 5/2012 |
| TW | 201425180 | 7/2014 |
| WO | WO 97/016932 | 5/1997 |
| WO | WO 00/051190 | 8/2000 |
| WO | WO 01/059558 | 8/2001 |
| WO | WO 01/089003 | 11/2001 |
| WO | WO 02/073587 | 9/2002 |
| WO | WO 03/038800 | 5/2003 |
| WO | WO 03/100550 | 12/2003 |
| WO | WO 06/057770 | 6/2006 |
| WO | WO 07/114631 | 10/2007 |
| WO | WO 08/075082 | 6/2008 |
| WO | WO 09/038862 | 3/2009 |
| WO | WO 09/068986 | 6/2009 |
| WO | WO 09/097866 | 8/2009 |
| WO | WO 09/122331 | 10/2009 |
| WO | WO 09/150287 | 12/2009 |
| WO | WO 10/085575 | 7/2010 |
| WO | WO 10/087925 | 8/2010 |
| WO | WO 11/007263 | 1/2011 |
| WO | WO 12/052635 | 4/2012 |
| WO | WO 12/129247 | 9/2012 |
| WO | WO 13/069148 | 5/2013 |
| WO | WO 13/150667 | 10/2013 |
| WO | WO 13/169299 | 11/2013 |
| WO | WO 13/169302 | 11/2013 |
| WO | WO 13/173838 | 11/2013 |
| WO | WO 13/186846 | 12/2013 |
| WO | WO 13/186847 | 12/2013 |
| WO | WO 14/018086 | 1/2014 |
| WO | WO 14/098077 | 6/2014 |
| WO | WO 15/023670 | 2/2015 |

OTHER PUBLICATIONS

Actuator definition downloaded from http://www.thefreedictionary.com/actuator on May 3, 2018, 2 pages.

Astronomer's Toolbox, "The Electromagnetic Spectrum," http://imagine.gsfc.nasa.gov/science/toolbox/emspectrum1.html, updated Mar. 2013, 4 pages.

Nasser et al., "Preliminary Evaluation of a Shape-Memory Alloy Tactile Feedback Display," Advances in Robotics, Mechantronics, and Haptic Interfaces, ASME, DSC—vol. 49, pp. 73-80, 1993.

Hill et al., "Real-time Estimation of Human Impedance for Haptic Interfaces," Stanford Telerobotics Laboratory, Department of Mechanical Engineering, Stanford University, Third Joint Eurohaptics Conference and Symposium on Haptic Interfaces for Virtual Environment and Teleoperator Systems, Salt Lake City, Utah, Mar. 18-20, 2009, pp. 440-445.

Kim et al., "Tactile Rendering of 3D Features on Touch Surfaces," UIST '13, Oct. 8-11, 2013, St. Andrews, United Kingdom, 8 pages.

Lee et al, "Haptic Pen: Tactile Feedback Stylus for Touch Screens," Mitsubishi Electric Research Laboratories, http://wwwlmerl.com, 6 pages, Oct. 2004.

Nakamura, "A Torso Haptic Display Based on Shape Memory Alloy Actuators," Massachusetts Institute of Technology, 2003, pp. 1-123.

\* cited by examiner

BUTTON PROVIDING FORCE SENSING AND/OR HAPTIC OUTPUT

FIELD

The described embodiments generally relate to a button that provides force sensing and/or haptic output. More particularly, the described embodiments relate to a button having a force sensor (or tactile switch) that may trigger operation of a haptic engine of the button, and to alternative embodiments of a haptic engine for a button. The haptic engine may be a permanent magnet biased electromagnetic haptic engine (or a permanent magnet biased normal flux electromagnetic haptic engine).

BACKGROUND

A device such as a smartphone, tablet computer, or electronic watch may include a button that is usable to provide input to the device. In some cases, the button may be a volume button. In some cases, the button may be context-sensitive, and may be configured to receive different types of input based on an active context (e.g., an active utility or application) running on the device. Such a button may be located along a sidewall of a device, and may move toward the sidewall when a user presses the button. Pressing the button with an applied force that exceeds a threshold may trigger actuation (e.g., a state change) of a mechanical switch disposed behind the button. In some cases, a button may pivot along the sidewall. For example, the top of the button may be pressed and pivot toward the sidewall to increase a sound volume, or the bottom of the button may be pressed and pivot toward the sidewall to decrease the sound volume.

SUMMARY

Embodiments of the systems, devices, methods, and apparatus described in the present disclosure are directed to a button that provides force sensing and/or haptic output. In some cases, a button may be associated with a force sensor (or tactile switch) that triggers operation of a haptic engine in response to detecting a force (or press) on the button. The haptic engine may be a permanent magnet biased electromagnetic haptic engine (or a permanent magnet biased normal flux electromagnetic haptic engine).

In a first aspect, the present disclosure describes a module having a permanent magnet biased electromagnetic haptic engine. The haptic engine may include a stator and a shuttle. A constraint may be coupled to the stator and the shuttle. A force sensor may be at least partially attached to the permanent magnet biased electromagnetic haptic engine, and may be configured to sense a force applied to the module. The constraint may be configured to constrain closure of a gap between the stator and the shuttle and bias the shuttle toward a rest position in which the shuttle is separated from the stator by the gap.

In another aspect, the present disclosure describes another module. The module may include a haptic engine, a force sensor, and a constraint. The haptic engine may include a stationary portion and a movable portion. The movable portion may be configured to move linearly, when the haptic engine is stimulated by an electrical signal, to provide a haptic output. The force sensor may be at least partially attached to the haptic engine and configured to sense a force applied to the module. The constraint may be configured to constrain movement of the movable portion relative to the stationary portion and bias the movable portion toward a rest position in which the movable portion is separated from the stationary portion by a gap.

In still another aspect of the disclosure, a method of providing a haptic response to a user is described. The method may include constraining relative motion between a stationary portion and a movable portion of a haptic engine, to bias the movable portion toward a rest position in which the movable portion is separated from the stationary portion by a gap, and to constrain closure of the gap. The method may further include determining a force applied to a button using a force sensor, where the button is mechanically coupled to the movable portion; determining the determined force matches a predetermined force; identifying a haptic actuation waveform associated with the predetermined force; and applying the haptic actuation waveform to the haptic engine. The relative motion between the stationary portion and the movable portion may be constrained to translation of the movable portion along an axis.

In addition to the aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
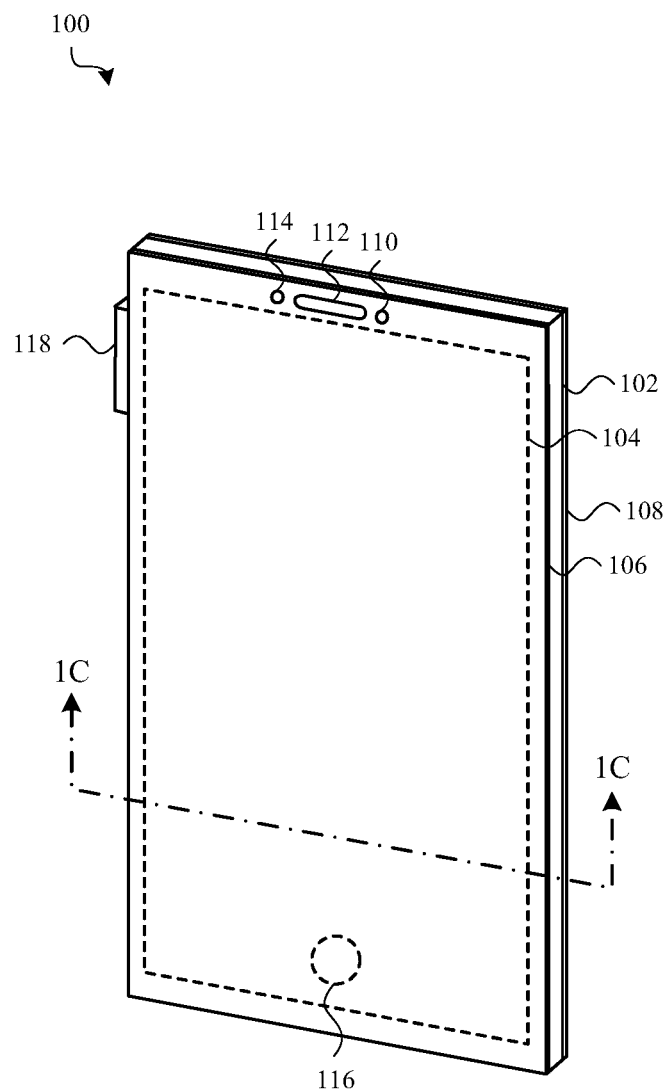
FIGS. 1A-1C show an example of an electronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

Described herein are techniques that enable a button to provide force sensing and/or haptic output functionality. In some cases, a button may be associated with a force sensor that triggers operation of a haptic engine in response to detecting a force on the button. In other cases, the force sensing and haptic output functions may be decoupled. The haptic engine may be a permanent magnet biased electromagnetic haptic engine (or a permanent magnet biased normal flux electromagnetic haptic engine)—e.g., a haptic engine having a rotor or shuttle that is biased by one or more permanent magnets, and electromagnetically actuated.

In some embodiments, the haptic engine and force sensor associated with a button may be combined in a single module.

In some embodiments, the force sensor associated with a button may include a plurality of force sensing elements distributed in one, two, or three dimensions. Such force sensing elements may be used to determine both the amount of force applied to the button, as well as a location of the force. In this manner, and by way of example, a button that does not move when pressed may be operated as the functional equivalent of a button that can be pressed in multiple locations, such as a volume button that can be pressed along a top portion or a bottom portion to increase or lower a sound volume.

In some embodiments, the force sensor associated with a button may sense a force pattern applied to a button, such as a sequence of longer or shorter presses. The force sensor may also or alternatively be configured to distinguish a button tap from a button press having a longer duration.

In some embodiments, the haptic engine associated with a button may be driven using different haptic actuation waveforms, to provide different types of haptic output. The different haptic actuation waveforms may provide different haptic output at the button. In some embodiments, a processor, controller, or other circuit associated with a button, or a circuit in communication with the button, may determine whether a force applied to the button matches a predetermined force, and if so, stimulate the haptic engine using a particular haptic actuation waveform that has been paired with the predetermined force. A haptic engine may also be stimulated using different haptic actuation waveforms based on a device's context (e.g., based on an active utility or application).

In some embodiments, a module providing force sensing and haptic output functionality may be programmed to customize the manner in which force sensing is performed or haptic output is provided.

Various of the described embodiments may be operated at low power or provide high engine force density (e.g., a high force with low travel). In an embodiment incorporating the features described with reference to FIGS. 3, 4A-4C, 10A-10B, & 13A, a haptic output providing nearly 2 Newtons (N) of force (e.g., 1 N of rotational force on one side of a rotor and 1N of rotational force on the other side of the rotor, providing a net rotational force of 2 N) and a torque of 2.5 N-millimeters (Nmm) has been generated with a haptic engine volume of less than 150 cubic millimeters ($mm^3$) and button travel of ±0.10 mm. Such performance is significantly better than the haptic output of known button alternatives of similar and larger size.

The haptic engine embodiments described herein can provide a haptic output force that increases linearly with the current applied to the haptic engine and movement of a rotor or shuttle.

These and other embodiments are described with reference to FIGS. 1A-19. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. The use of alternative terminology, such as "or", is intended to indicate different combinations of the alternative elements. For example, A or B is intended to include, A, or B, or A and B.

Figure 1B:
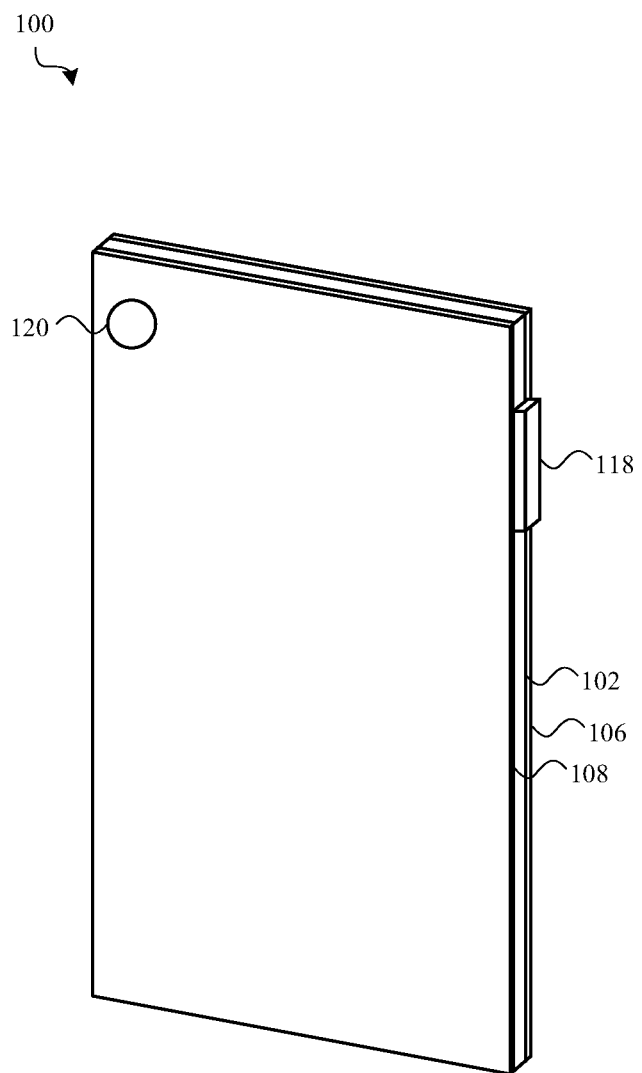
Figure 1C:
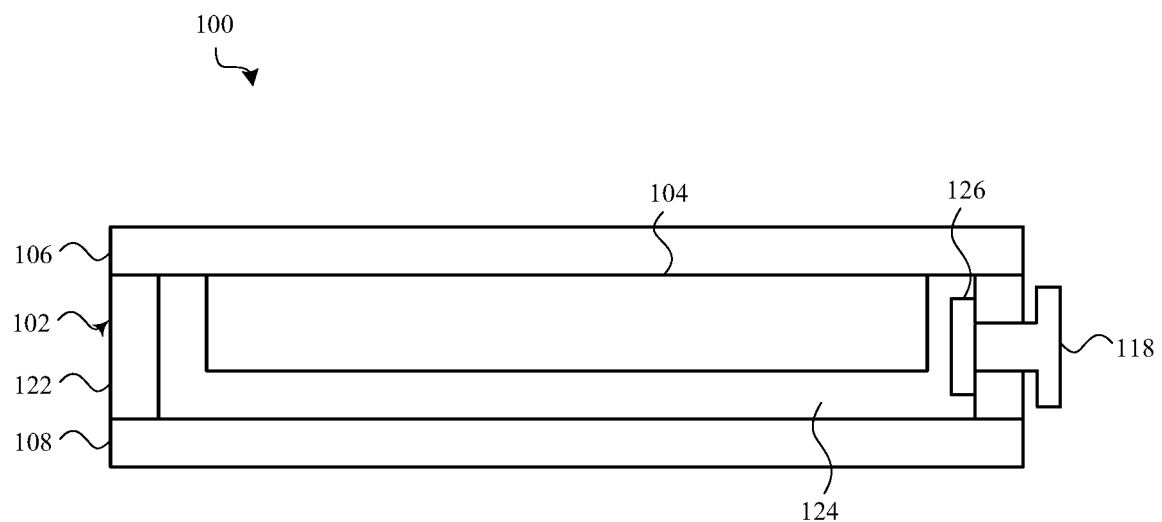

FIGS. 1A-1C show an example of an electronic device or simply "device" 100. The device's dimensions and form factor, including the ratio of the length of its long sides to the length of its short sides, suggest that the device 100 is a mobile phone (e.g., a smartphone). However, the device's dimensions and form factor are arbitrarily chosen, and the device 100 could alternatively be any portable electronic device including, for example a mobile phone, tablet computer, portable computer, portable music player, health monitor device, portable terminal, or other portable or mobile device. FIG. 1A shows a front isometric view of the device 100; FIG. 1B shows a rear isometric view of the device 100; and FIG. 1C shows a cross-section of the device 100. The device 100 may include a housing 102 that at least partially surrounds a display 104. The housing 102 may include or support a front cover 106 or a rear cover 108. The front cover 106 may be positioned over the display 104, and may provide a window through which the display 104 may be viewed. In some embodiments, the display 104 may be attached to (or abut) the housing 102 and/or the front cover 106.

As shown in FIGS. 1A & 1B, the device 100 may include various other components. For example, the front of the device 100 may include one or more front-facing cameras 110, speakers 112, microphones, or other components 114 (e.g., audio, imaging, or sensing components) that are configured to transmit or receive signals to/from the device 100. In some cases, a front-facing camera 120, alone or in combination with other sensors, may be configured to operate as a bio-authentication or facial recognition sensor. The device 100 may also include various input devices, including a mechanical or virtual button 116, which may be located along the front surface of the device 100. The device 100 may also include buttons or other input devices positioned along a sidewall of the housing 102 and/or on rear surface of the device 100. For example, a volume button or multi-purpose button 118 may be positioned along the sidewall of the housing 102, and in some cases may extend through an aperture in the sidewall. By way of example, the rear surface of the device 100 is shown to include a rear-facing camera 120 or other optical sensor (see, FIG. 1B). A flash or light source may also be positioned along the rear of the device 100 (e.g., near the camera 120). In some cases, the rear surface of the device may include multiple rear-facing cameras.

As discussed previously, the device 100 may include a display 104 that is at least partially surrounded by the housing 102. The display 104 may include one or more display elements including, for example, a light-emitting display (LED), organic light-emitting display (OLED), liquid crystal display (LCD), electroluminescent display (EL), or other type of display element. The display 104 may also include one or more touch and/or force sensors that are configured to detect a touch and/or a force applied to a surface of the cover 106. The touch sensor may include a capacitive array of nodes or elements that are configured to detect a location of a touch on the surface of the cover 106. The force sensor may include a capacitive array and/or strain sensor that is configured to detect an amount of force applied to the surface of the cover 106.

FIG. 1C depicts a cross-section of the device 100 shown in FIGS. 1A and 1B. As shown in FIG. 1C, the rear cover 108 may be a discrete or separate component that is attached to the sidewall 122. In other cases, the rear cover 108 may be integrally formed with part or all of the sidewall 122.

As shown in FIG. 1C, the sidewall 122 or housing 102 may define an interior volume 124 in which various electronic components of the device 100, including the display 104, may be positioned. In this example, the display 104 is at least partially positioned within the internal volume 128 and attached to an inner surface of the cover 106. A touch sensor, force sensor, or other sensing element may be integrated with the cover 106 and/or the display 104 and may be configured to detect a touch and/or force applied to an outer surface of the cover 106. In some cases, the touch sensor, force sensor, and/or other sensing element may be positioned between the cover 106 and the display 104.

The touch sensor and/or force sensor may include an array of electrodes that are configured to detect a location and/or force of a touch using a capacitive, resistive, strain-based, or other sensing configuration. The touch sensor may include, for example, a set of capacitive touch sensing elements, a set of resistive touch sensing elements, or a set of ultrasonic touch sensing elements. When a user of the device touches the cover 106, the touch sensor (or touch sensing system) may detect one or more touches on the cover 106 and determine locations of the touches on the cover 106. The touches may include, for example, touches by a user's finger or stylus. A force sensor or force sensing system may include, for example, a set of capacitive force sensing elements, a set of resistive force sensing elements, or one or more pressure transducers. When a user of the device 100 presses on the cover 106 (e.g., applies a force to the cover 106), the force sensing system may determine an amount of force applied to the cover 106. In some embodiments, the force sensor (or force sensing system) may be used alone or in combination with the touch sensor (or touch sensing system) to determine a location of an applied force, or an amount of force associated with each touch in a set of multiple contemporaneous touches.

FIG. 1C further shows the button 118 along the sidewall 122 The button may be accessible to a user of the device 100 and extend outward from the sidewall 122. In some cases, a portion of the button 118 may be positioned within a recess in the sidewall 122. Alternatively, the entire button 118 may be positioned within a recess in the sidewall 122, and the button 118 may be flush with the housing or inset into the housing.

The button may extend through the housing and attach to a haptic engine and force sensor. In some embodiments, the haptic engine and force sensor may be combined in a single module 126. By way of example, the haptic engine may include a permanent magnet biased electromagnetic haptic engine, or a permanent magnet normal flux electromagnetic haptic engine. Also by way of example, the haptic engine may cause the button to pivot back-and-forth in relation to an axis, translate back-in forth parallel to the sidewall 122, or translate back-and-forth transverse to the sidewall 122. The force sensor may include, for example, a capacitive force sensor, a resistive force sensor, an ultrasonic force sensor, or a pressure sensor.

Figure 2A:
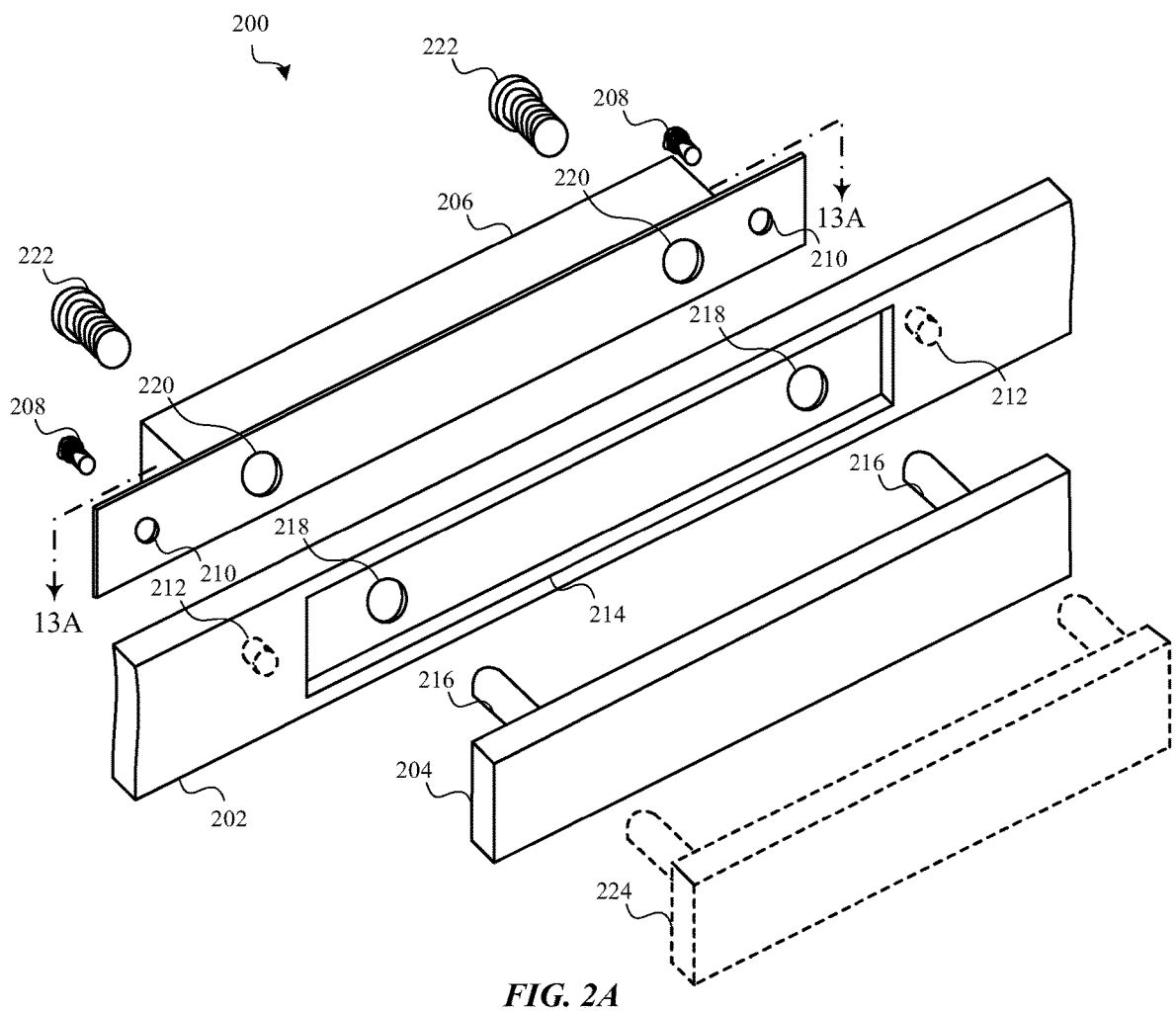
FIGS. 2A & 2B show partially exploded views of button assemblies in relation to a housing.

FIG. 2A shows a partially exploded view of a button assembly 200 in relation to a housing (e.g., the sidewall 202). The button assembly 200 may include a button 204 and a button base 206. The button base 206 may be mechanically coupled to an interior of the housing. For example, the button base 206 may be mounted to an interior of the sidewall 202, which may be an example of the sidewall 122 described with reference to FIGS. 1A-1C. The button base 206 may be mechanically coupled to the sidewall 202 by one or more screws 208 that extend through one or more holes 210 in the button base 206. Each screw 208 may be threaded into a hole 212 along an interior surface of the sidewall 202 such that a screw head of the screw 208 bears against a surface of the button base 206 opposite the sidewall 202 and holds the button base 206 against the sidewall 202. The button base 206 may also or alternatively be mechanically coupled to the interior surface of the sidewall 202 by other means, such as by an adhesive or welds. In some embodiments, an o-ring, leap seal, diaphragm seal, or other type of seal may be positioned or formed between each leg 216 of the button 204 and the sidewall 202. Alternatively or additionally, a gasket or seal may be positioned or formed between the button base 206 and sidewall 202. The gasket or seal may prevent moisture, dirt, or other contaminants from entering a device through a button base-to-sidewall interface. In some cases, the sidewall 202 may have a recess 214 in which part or all of the button 204 may reside, or over which part or all of the button 204 may be positioned. In other cases, the sidewall 202 need not have such a recess 214.

The button base 206 may include a haptic engine and a force sensor (e.g., a capacitive force sensor or strain sensor). The haptic engine may include a stationary portion (e.g., a stator) and a movable portion (e.g., a rotor or shuttle). In some cases, the haptic engine may include multiple stationary portions (e.g., a first stator and a second stator, a button base housing, and so on) or multiple movable portions. One or more components of the haptic engine (e.g., one or more of the stationary portion(s) and/or movable portion(s)) may be stimulated to provide a haptic output to the button 204. For example, an electrical signal (e.g., an alternating current) may be applied to a coil (i.e., a conductive coil) wound around a stationary or movable portion of the haptic engine, thereby selectively increasing the flux of a magnetic field produced by one or more permanent magnets that bias the haptic engine, and periodically reversing the direction of the flux to cause the movable portion(s) to move with respect to the stationary portion(s) and provide a haptic output as the movable portion(s) move back-and-forth. The flux is "selectively" increased in that it is increased on some faces of a rotor or shuttle and decreased on opposing faces, resulting in an increased net rotational force that provides or increases a torque about an axis of a rotor, or an increased net translational force that provides or increases a force along an axis of a shuttle. In cases where the movable portion includes a rotor, the movable portion may be configured to move non-linearly (e.g., pivot) when the haptic engine is stimulated to provide a haptic output. In cases where the movable portion includes a shuttle, the movable portion may be configured to move linearly (e.g., translate) when the haptic engine is stimulated to provide a haptic output. In some cases, the button base 206 may include a constraint, which constraint may be configured to constrain movement of the movable portion(s) relative to the stationary portion(s) (e.g., constrain closure of a gap between a movable portion and a stationary portion), bias the movable portion toward a rest position in which the movable portion is separated from the stationary portion by a gap, and/or guide or constrain motion to motion along a desired path.

The button 204 may have a first major surface and a second major surface. The first major surface may be a user interaction surface that faces away from the sidewall 202, and the second major surface may be a device-facing surface that faces toward the sidewall 202. One or more legs 216 may extend perpendicularly from the second major surface. By way of example, two legs 216 are shown in FIG. 2A. The legs 216 may be aligned with and inserted through respective holes 218, 220 in the sidewall 202 and button base 206, and may be mechanically coupled to the movable portion of the haptic engine. In some cases, the leg(s) 216 may be mechanically coupled to the movable portion by one or more screws 222 that extend through one or more holes in the movable portion. Each screw 222 may be threaded into a hole in a respective leg 216 of the button 204 such that a screw head of the screw 222 bears against a surface of the movable portion opposite the leg 216 and mechanically couples the button 204 to the movable portion.

The force sensor may include components attached to one or more components of the haptic engine, or more generally, to the button base 206. In some embodiments, different components of the force sensor may be attached to the movable portion or stationary portion of the haptic engine, and may be separated by a capacitive gap. A force applied to the button (e.g., a user's press) may cause the movable portion to move toward or away from the stationary portion, thereby changing the width of the capacitive gap and enabling the applied force (or an amount or location of the applied force) to be detected. In some embodiments, the force sensor may include one or more strain sensors disposed on the button base 206 or button 204. In these latter embodiments, flex of the button base 206 (e.g., the housing of, or a mount for, the button base 206), one or more components within the button base 206 (e.g., a stator, rotor, shuttle, or other component capable of flexing), or the button 204, in response to a force applied to the button 204, may cause a change in the output of a strain sensor (e.g., a strain gauge), which output enable the applied force (or an amount or location of the applied force) to be detected.

Figure 2B:
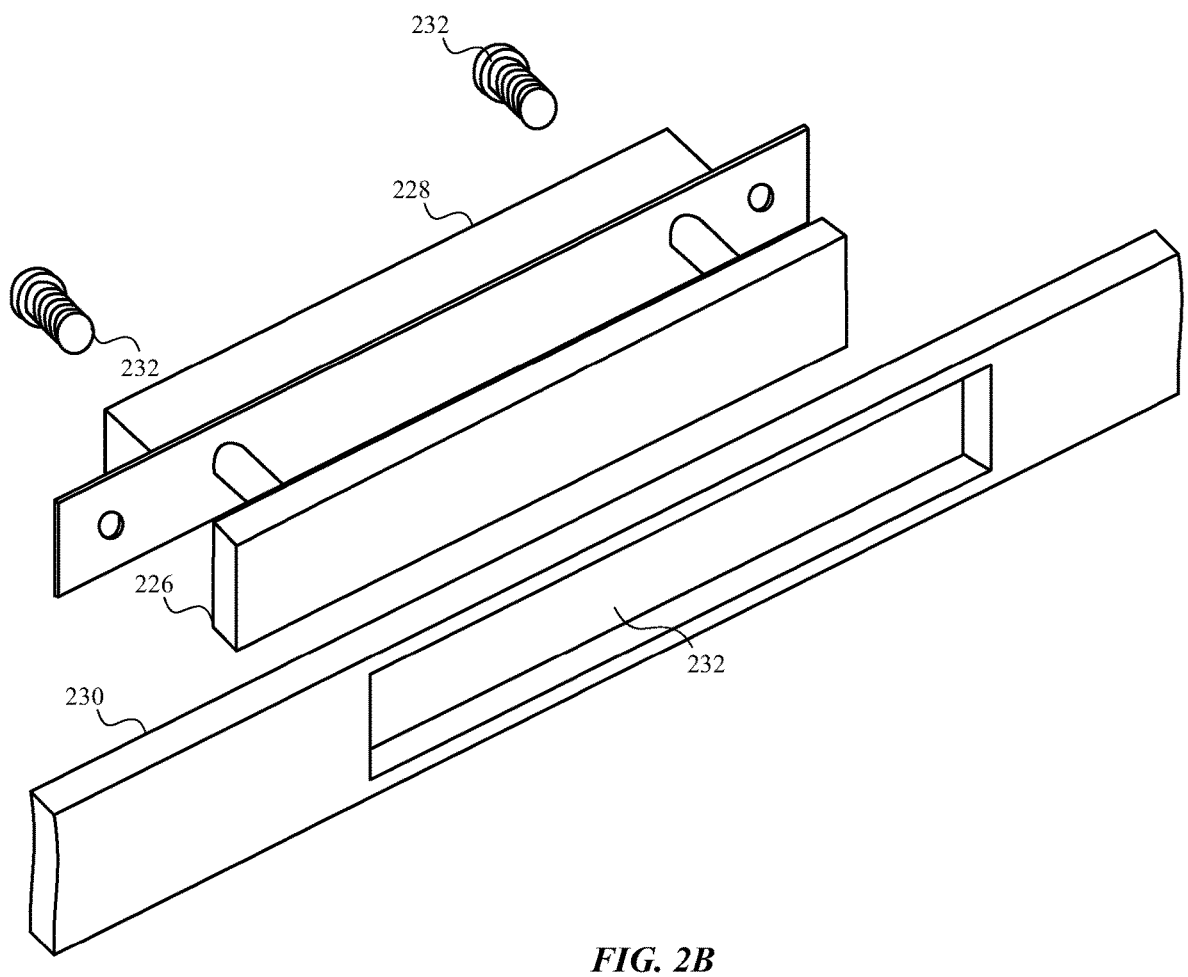

As shown in phantom in FIG. 2A, the configuration of the button base 206 may enable it to be used with different sizes, shapes, or styles of buttons (e.g., button 204 or button 224). In alternative embodiments, and as shown in FIG. 2B, a button 226 may be permanently or semi-permanently attached to a button base 228 (e.g., by one or more welds). In these embodiments, a sidewall 230 of a housing may include an opening 232 through which the button 226 may be inserted before the button base 228 is mechanically coupled to the sidewall 230 (e.g., using one or more screws 222).

Figure 2C:
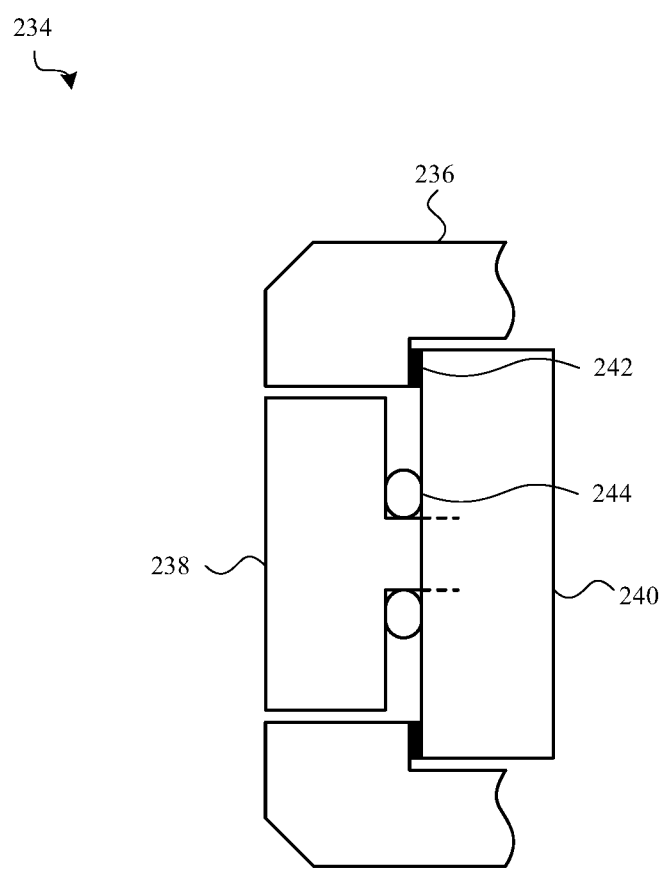
FIG. 2C shows a cross-section of an alternative configuration of a button assembly.

FIG. 2C shows a cross-section of an alternative configuration of a button assembly 234. The cross-section shows portions of a device sidewall 236, with a button 238 extending through an opening in the sidewall 236. A button base 240 may be attached to an interior of the sidewall 236 by an adhesive, welds, or other attachment mechanism 242, and the button 238 may be removably or semi-permanently attached to the button base 240, as described with reference to FIG. 2A or 2B for example. In the embodiment shown in FIG. 2C, the button base 240 (and in some cases a stator portion of the button base 240) may form a portion of the sidewall 236 that faces the button 238 (e.g., a portion of the sidewall 236 below the button 238). An o-ring or other type of seal 244 may surround each leg of the button 238 to prevent moisture and debris from entering the button base 240 or interfering with other components interior to the sidewall 236.

Figure 3:
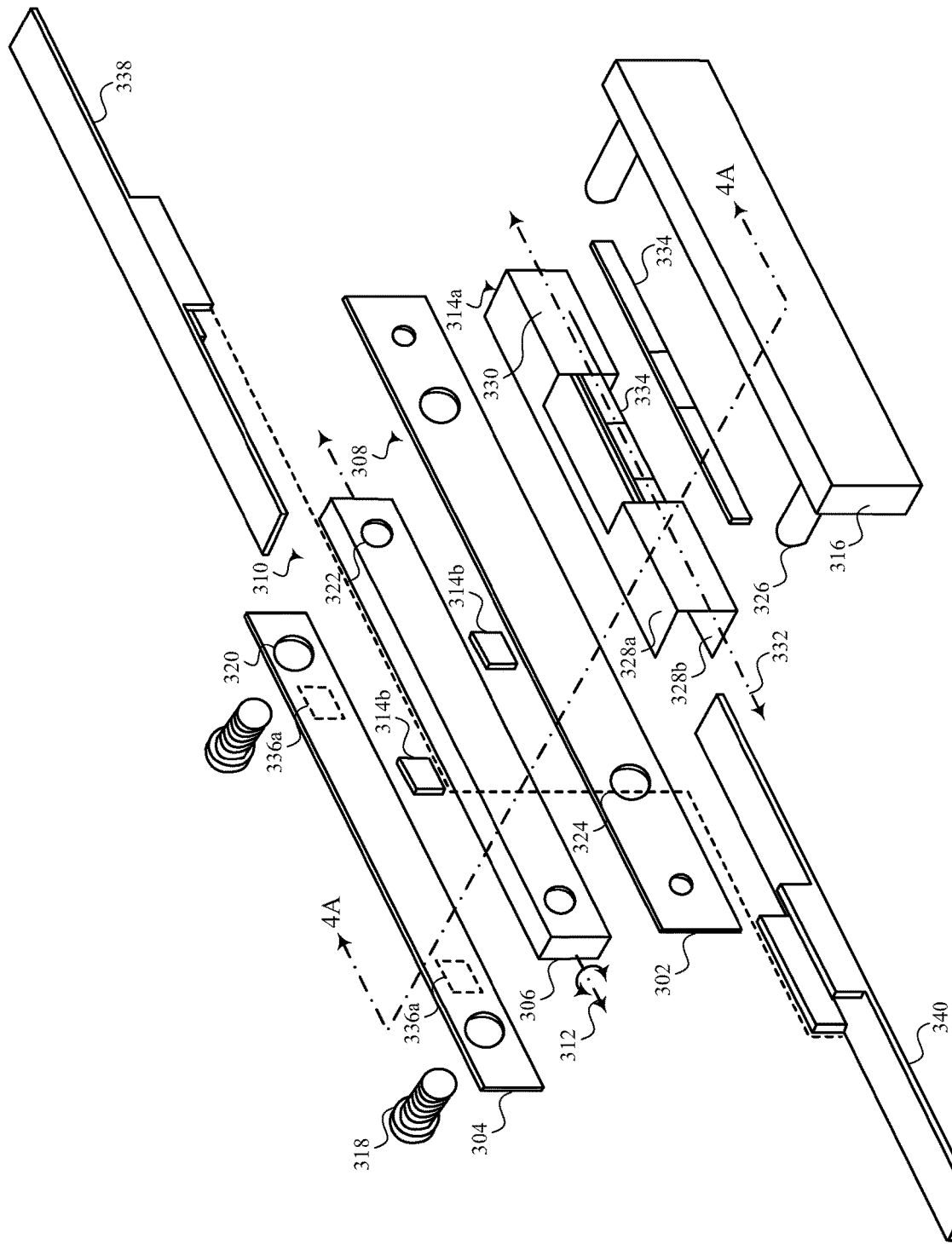
FIG. 3 shows an exploded view of an example haptic engine.

FIG. 3 shows an exploded view of an example haptic engine 300. The haptic engine 300 is an example of the haptic engine included in the button base 206 described with reference to FIGS. 2A & 2B, and in some cases may be a permanent magnet biased electromagnetic haptic engine (or a permanent magnet biased normal flux electromagnetic haptic engine).

The haptic engine 300 may include one or more stationary portions and one or more movable portions, in addition to a constraint 314 that is configured to constrain movement of the movable portion(s) relative to the stationary portion(s) and bias the movable portion(s) toward a rest position in which the movable portion(s) are separated from the stationary portion(s) by one or more gaps. By way of example, the stationary portion(s) may include a pair of ferritic stators (e.g., a first stator 302 and a second stator 304), and the movable portion(s) may include a rotor 306 that is positioned between the first and second stators 302, 304. In some embodiments, the first and second stators 302, 304 may be held in a spaced apart position by one or more brackets 338, 340 that may be welded or clipped to the stators 302, 304. When the components of the haptic engine 300 are assembled, the rotor 306 may be separated from the first stator 302 by a first gap 308 (e.g., a first rotor-to-stator gap), and from the second stator 304 by a second gap 310 (e.g., a second rotor-to-stator gap). The rotor 306 may be configured to move non-linearly (e.g., pivot about a longitudinal axis 312 parallel to each of the first and second stators 302, 304, the rotor 306, and a sidewall to which a button base including the haptic engine 300 is mounted). The constraint 314 may constrain closure of the first and second gaps 308, 310 and bias the rotor 306 toward a rest position in which the rotor 306 is separated from the first and second stators 302, 304 by the first and second gaps 308, 310. The rotor 306 may have a height that would allow it to pivot about the longitudinal axis 312 and contact (e.g., crash against) the first stator 302 and/or the second stator 304 in the absence of the constraint 314.

A button 316 may be mechanically coupled to the haptic engine 300. For example, a button 316 may be mechanically coupled to the rotor 306, such that movement of the rotor 306 may provide a haptic output to the button 316. In some cases, the button 316 may be attached to the rotor 306 by screws 318 that pass through holes 320, 322, 324 in the second stator 304, the rotor 306, and the first stator 302. The screws 318 may be received by threaded inserts in the legs 326 of the button 316, and heads of the screws 318 may bear against a surface of the rotor 306.

In some embodiments, the constraint 314 may include a flexure 314a that has rotor attachment portions 328a, 328b on either side of a stator attachment portion 330. The stator attachment portion 330 may be attached to the first stator 302, and the rotor attachment portions 328a, 328b (e.g., one or more arms or extensions extending from the stator attachment portion 330) may be attached to the rotor 306. In some embodiments, the stator attachment portion 330 may be attached to the first stator 302 along an axis 332 of the flexure 314a. The flexure 314a may constrain movement of the rotor 306 to movement about a pivot axis (e.g., the longitudinal axis 312), and may provide a linearly consistent stiffness opposing the pivot movement. In some cases, the flexure 314a may be a metal flexure that is welded or clamped to the first stator 302 (e.g., clamped to the first stator 302 by a clamp 334 that is welded to the first stator 302; in FIG. 3, the clamp 334 is shown to include two strips aligned with the axis 332 of the flexure 314a). In some cases, the rotor attachment portions 328a, 328b may be welded to the sides of a rotor core, or otherwise clipped or fastened to a rotor core, such that movement of the rotor 306 imparts forces to the arms 328a, 328b of the flexure 314a, and the flexure 314a in turn imparts forces to the rotor core to constrain movement of the rotor 306. The forces imparted by the flexure 314a may be stronger than forces imparted by the rotor 306 when the haptic engine 300 is not being stimulated by an electrical signal to produce haptic output at the button 316, but weaker than the forces imparted by the rotor 306 when the haptic engine 300 is stimulated by an electrical signal to produce haptic output. In this manner, the flexure 314a may bias the rotor 306 toward a rest position in which the rotor 306 is separated from the stators 302, 304 by rotor-to-stator gaps, but stimulation of the haptic engine 300 by an electrical signal may overcome the forces imparted to the rotor 306 by the flexure 314a, at least to a degree, and cause the rotor 306 to pivot back-and-forth between the stators 302, 304.

As another example, the constraint 314 may alternatively or additionally provided by a set of one or more elastomers (e.g., one or more elastomeric pads, such as silicone pads) or other compliant material(s) 314b. The compliant material(s) 314b may be disposed (positioned) between the first stator 302 and the rotor 306 in the first gap 308, and/or between the second stator 304 and the rotor 306 in the second gap 310. The compliant material(s) 314b may constrain movement of the rotor 306 to movement about a pivot axis (e.g., the longitudinal axis 312). The compliant material(s) 314b may also damp movement of the rotor 306. In some cases, the compliant material(s) 314b may be adhesively bonded to the rotor 306 and one or more of the stators 302, 304. Similarly to the flexure 314a, the forces imparted by the compliant material(s) 314b may be stronger than forces imparted by the rotor 306 when the haptic engine 300 is not being stimulated by an electrical signal to produce haptic output at the button 316, but weaker than the forces imparted by the rotor 306 when the haptic engine 300 is stimulated by an electrical signal to produce haptic output. In this manner, the compliant material(s) 314b may bias the rotor 306 toward a rest position in which the rotor 306 is separated from the stators 302, 304 by rotor-to-stator gaps, but stimulation of the haptic engine 300 by an electrical signal may overcome the forces imparted to the rotor 306 by the compliant material(s) 314b, at least to a degree, and cause the rotor 306 to pivot back-and-forth between the stators 302, 304.

The compliant material(s) 314b may be aligned with an axis of the button 316, as shown in FIG. 3, or distributed along an axis, plane, or planes that are transverse to a user interaction surface of the button 316 (e.g., in a one, two, or three-dimensional array).

In some alternative embodiments, the haptic engine 300 shown in FIG. 3 may include only one stator (e.g., the first stator 302), and the rotor 306 may move with respect to the one stator.

As also shown in FIG. 3, a force sensor 336 may be at least partially attached to the haptic engine 300. The force sensor 336 may be configured to sense a force applied to the haptic engine 300 or a module including the haptic engine 300. For example, the force sensor 336 may be configured to sense a force applied to the rotor 306 when a user presses the button 316. In some embodiments, the force sensor 336 may include one or more strain sensors 336a attached to the first stator 302 or the second stator 304. When a user applies a force to the button 316 (e.g., presses the button 316), the strain sensor(s) 336a may flex. Outputs of the strain sensor(s) 336a may change in a manner that is related to the amount or location of the force applied to the button 316. In alternative embodiments, the strain sensors 336a may be positioned elsewhere on the haptic engine 300, or on a housing of the haptic engine 300 (e.g., on the button base described with reference to FIG. 2A or 2B). In further alternative embodiments, the force sensor 336 may additionally or alternatively include a capacitive force sensor or other type of force sensor.

Figure 4A:
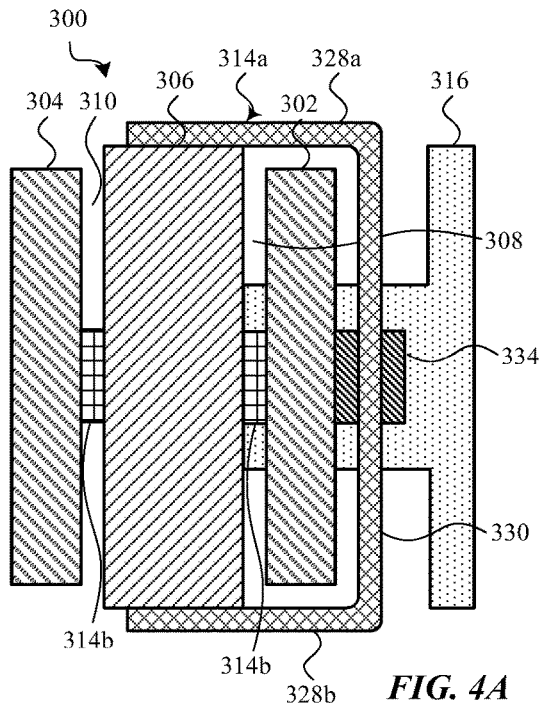
FIGS. 4A-4C show an assembled cross-section of the haptic engine and button described with reference to FIG. 3.
Figure 4B:
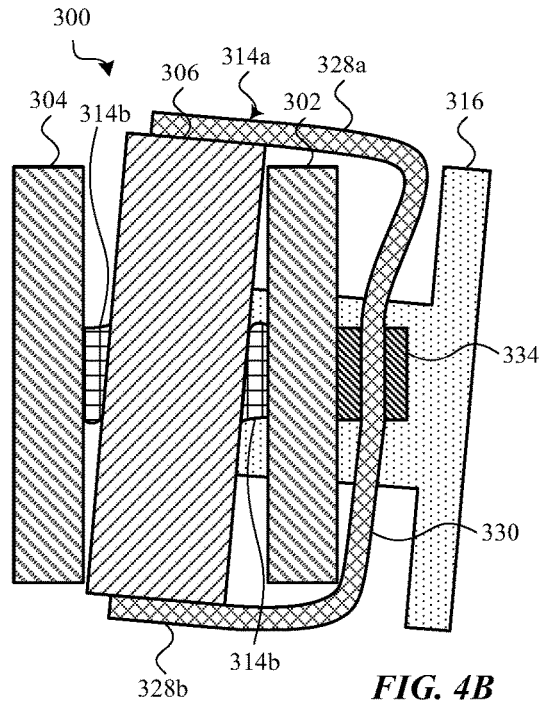
Figure 4C:
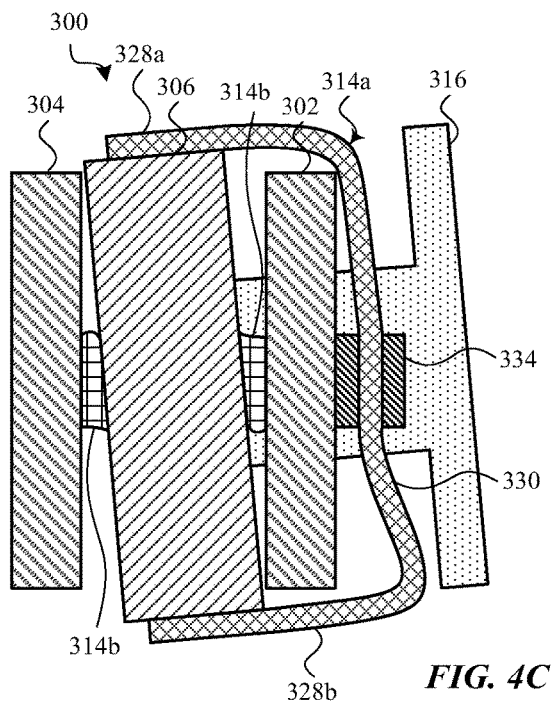

Turning now to FIGS. 4A-4C, there is shown an assembled cross-section of the haptic engine 300 and button 316 described with reference to FIG. 3. As shown, the arms 328a, 328b that extend from the flexure 314a may extend around upper and lower surfaces of the first stator 302, and may be attached to the upper and lower surfaces of the rotor 306 (e.g., to upper and lower surfaces or sides of a rotor core).

FIG. 4A shows the haptic engine 300 at rest. FIGS. 4B & 4C show the haptic engine 300 after it has been stimulated to provide a haptic output. More specifically, FIG. 4B shows the haptic engine 300 after the rotor 306 has pivoted clockwise to a maximum extent, and FIG. 4C shows the haptic engine 300 after the rotor 306 has pivoted counter-clockwise to a maximum extent. While the haptic engine 300 is being stimulated, the rotor 306 may pivot back-and-forth between the states shown in FIGS. 4B & 4C to provide haptic output to the button 316. Stimulation of the haptic engine 300 causes the rotor 306 to move non-linearly (e.g., pivot) with enough force to overcome the spring force of the flexure 314a and the shear force of the compliant material(s) 314b. After stimulation of the haptic engine 300 ceases, the spring force of the flexure 314a and/or the shear force(s) of the compliant material(s) 314b may be sufficient to restore the rotor 306 to the rest position shown in FIG. 4A.

Each of the flexure 314a and/or compliant material(s) 314b may be configured to provide a first stiffness opposing the non-linear movement of the rotor 306, and a second stiffness opposing a force applied to the button 316 (i.e., asymmetric first and second stiffnesses). This can enable the stiffnesses to be individually adjusted (e.g., to separately tune the force input and haptic output user experiences for the button 316).

Figure 5:
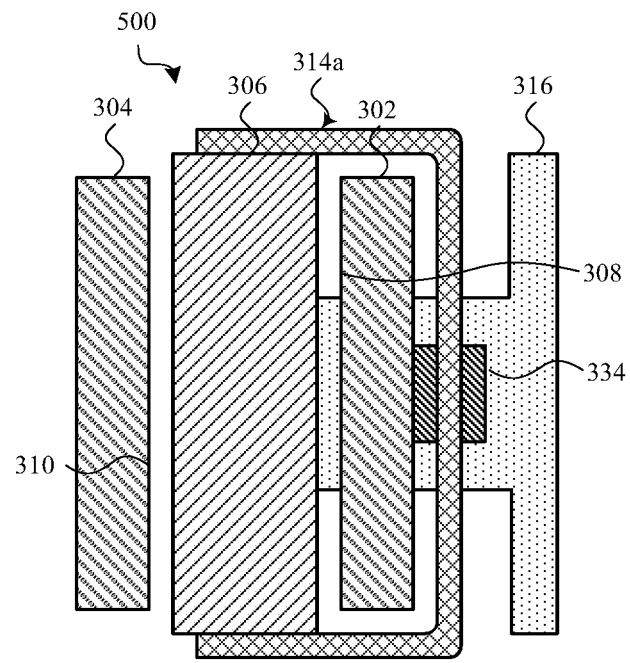
FIGS. 5-8, 9A & 9B show alternatives to the haptic engine described with reference to FIGS. 4A-4C.

FIG. 5 shows an alternative haptic engine 500 that is similar to the haptic engine 300 described with reference to FIGS. 4A-4C. The alternative haptic engine 500 lacks the compliant material(s) 314b and instead relies on the flexure 314a to constrain motion of the rotor 306.

Figure 6:
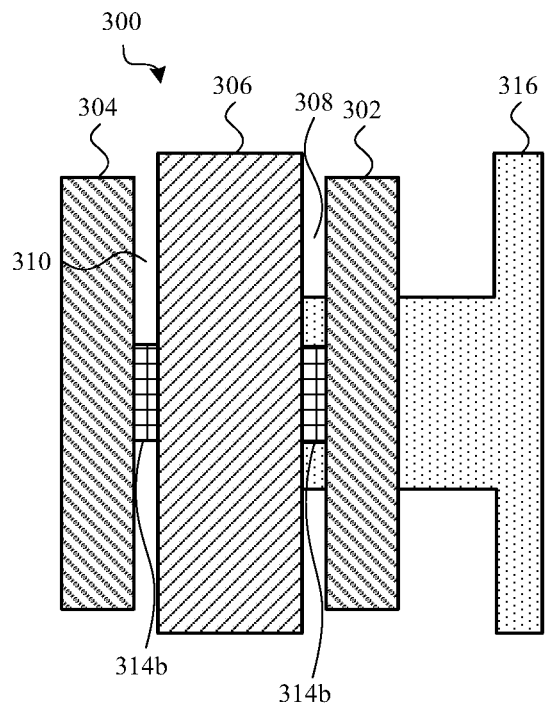

FIG. 6 shows another alternative haptic engine 600 that is similar to the haptic engine 300 described with reference to FIGS. 4A-4C. The alternative haptic engine 600 shown in FIG. 6 lacks the flexure 314a and relies instead on the compliant material(s) 314b to constrain motion of the rotor 306.

Figure 7:
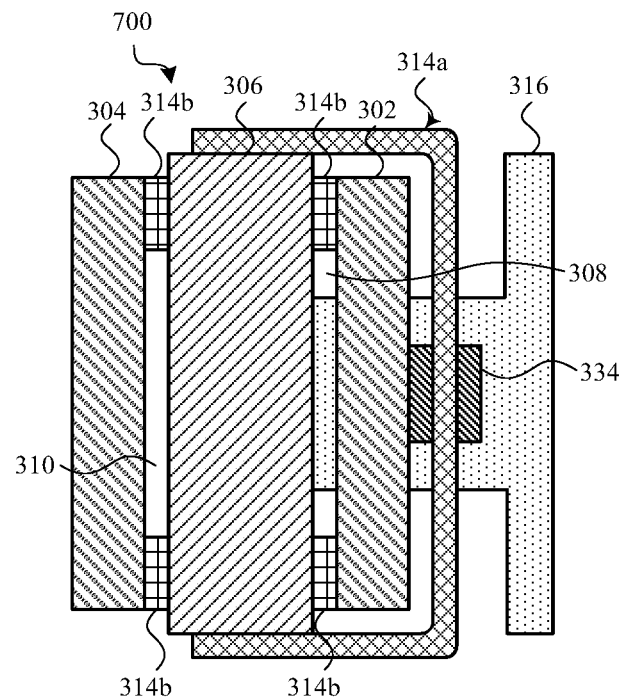

FIG. 7 shows yet another alternative haptic engine 700 that is similar to the haptic engine 300 described with reference to FIGS. 4A-4C. The alternative haptic engine 700 shown in FIG. 7 distributes the compliant material(s) 314b differently than what is shown in FIGS. 4A-4C. In particular, the compliant material(s) 314b may be positioned in a two or three-dimensional array, within the gaps 308, 310 between the stators 302, 304 and rotor 306.

Figure 8:
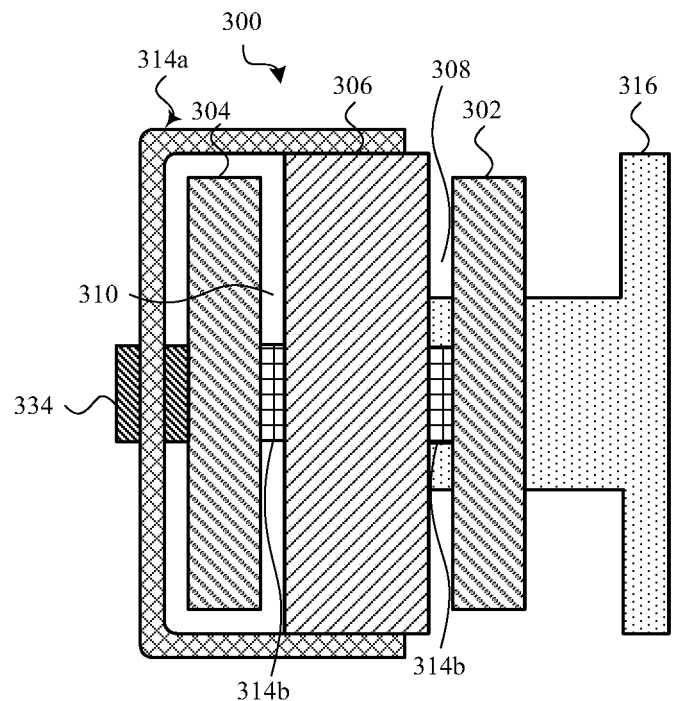

FIG. 8 shows a haptic engine 800 similar to that described with reference to FIGS. 4A-4C, but with the flexure 314a attached to the second stator 304 instead of the first stator 302. By attaching the flexure 314a to the haptic engine (e.g., to the second stator 304) along an axis disposed on a side of the rotor 306 opposite the button 316, instead of along an axis disposed on a same side of the rotor 306 as the button 316 (as shown in FIGS. 4A-4C), the moment arm of the rotor 306 with respect to the button 316 may be changed, and the haptic output provided to the button 316 may be changed.

Figure 9A:
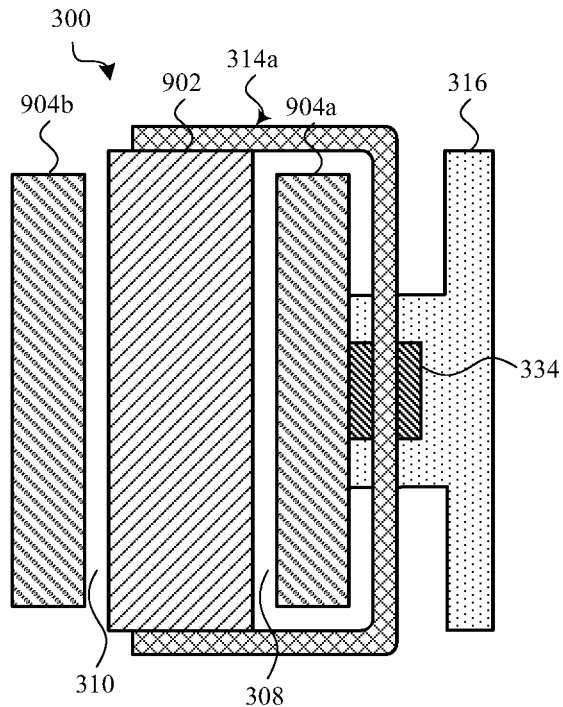
Figure 9B:
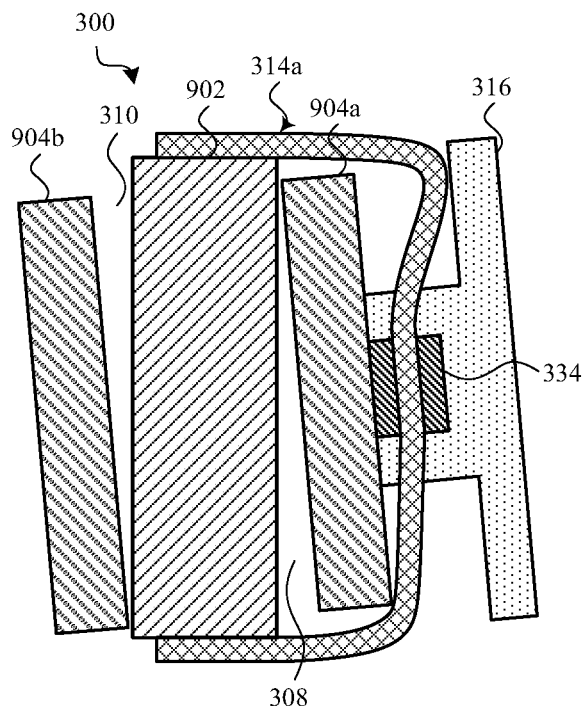

FIGS. 9A & 9B show a haptic engine 900 similar to that shown in FIGS. 4A-4C, but with the stator and rotor components swapped so that a stator 902 is positioned between portions 904a, 904b of a rotor 904. FIG. 9A shows the haptic engine 900 at rest, and FIG. 9B shows the haptic engine 900 with the rotor 904 in a left-most (or counter-clockwise) state. The embodiment shown in FIGS. 9A & 9B allows the button 906 to be attached to an outer component of the haptic engine 900 (e.g., to the rotor portion 904b). A flexure 314a or other constraint may be attached to the rotor 904 and stator 902 similarly to how a flexure 314 is attached to the stators 302, 304 and rotor 306 described with reference to FIGS. 4A-4C.

Figure 10A:
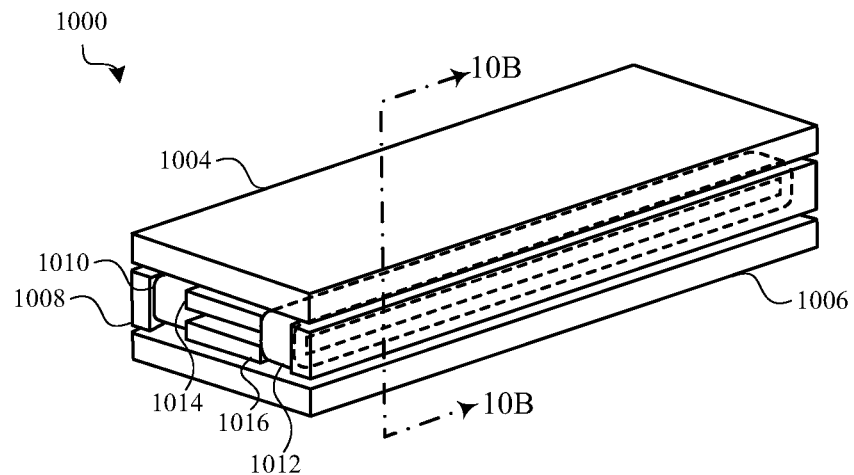
FIGS. 10A, 10B, 11A, 11B & 12A-12E show example embodiments of rotors.
Figure 10B:
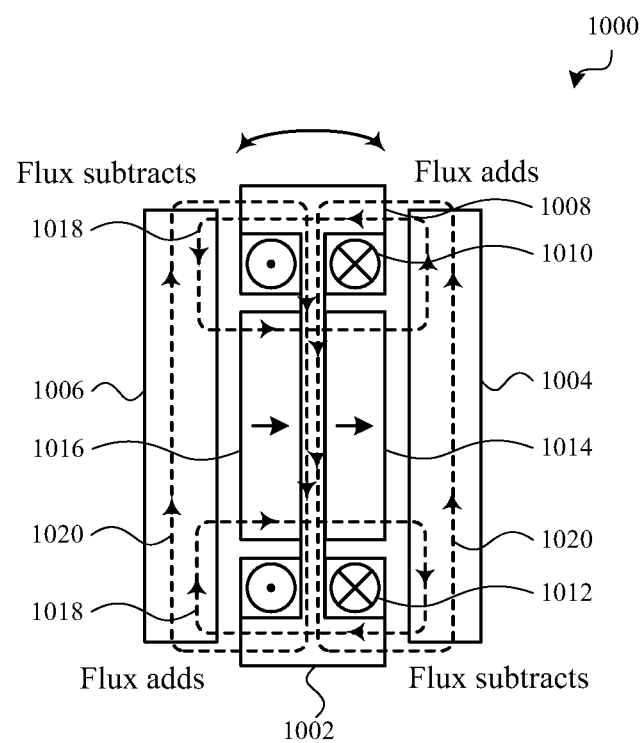

Referring now to FIGS. 10A & 10B, there is shown an example embodiment of the rotor described with reference to FIGS. 3, 4A-4C, 5-8, & 9A-9B.

FIGS. 10A-12E illustrate various examples of a permanent magnet biased electromagnetic haptic engine (or permanent magnet biased normal flux electromagnetic haptic engine). In some embodiments, one of the haptic engines described with reference to FIGS. 10A-12E may be used as the haptic engine described with reference to FIGS. 1A-9B.

FIGS. 10A & 10B show a haptic engine 1000 having a rotor 1002 positioned between first and second stators 1004, 1006. The stators 1004, 1006 may take the form of ferritic plates. The rotor 1002 may have an H-shaped core 1008 having two side plates connected by an intermediate plate that joins the two side plates. The different plates of the core 1008 may be attached (e.g., welded) to one another, or integrally formed as a monolithic component.

A first coil 1010 may be wound around the core 1008 (e.g., around the intermediate plate) near one side plate of the core 1008, and a second coil 1012 may be wound around the core 1008 (e.g., around the intermediate plate) near the other side plate of the core 1008. The first and second coils 1010, 1012 may be electrically connected in series or in parallel. A parallel connection of the coils 1010, 1012 may provide a reduction in the total resistance of the coils 1010, 1012, and/or may enable the use of a thinner wire to achieve the same resistance as a series connection of the coils 1010, 1012. A first permanent magnet 1014 may be attached to a first surface of the core 1008 (e.g., to a first surface of the intermediate plate), and a second permanent magnet 1016 may be attached to a second surface of the core 1008 (e.g., to a second surface of the intermediate plate, opposite the first surface of the intermediate plate). The first and second permanent magnets 1014, 1016 may be oriented with their north poles facing the same direction (e.g., to the right in FIG. 10B).

As shown in FIG. 10B, the permanent magnets 1014, 1016 may form a magnetic bias field indicated by flux 1018. The magnetic bias field may be differentially changed by flux 1020 when the haptic engine 1000 is stimulated by applying an electrical signal (e.g., a current) to the coils 1010, 1012. For example, the flux 1018 and 1020 may add at a first pair of opposite corners of the haptic engine 1000, and subtract at a second pair of opposite corners of the haptic engine 1000, thereby causing the rotor 1002 to pivot. The rotor 1002 may be caused to pivot in an opposite direction by reversing the current in the coils, or by removing the current and letting the momentum of the restorative force provided by a constraint (e.g., constraint 314a or 314b, not shown) to cause the rotor 306 to pivot in the opposite direction. Note that, in the absence of a constraint (e.g., the constraint 314a or 314b), the rotor 306 would pivot in the absence of an electrical signal applied to the coils 1010, 1012 and crash against the first and second stators 1004, 1006.

Figure 11A:
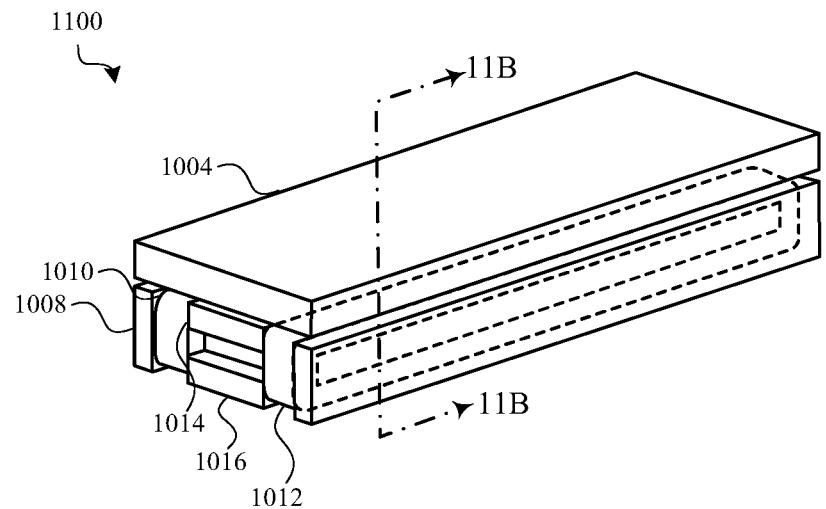
Figure 11B:
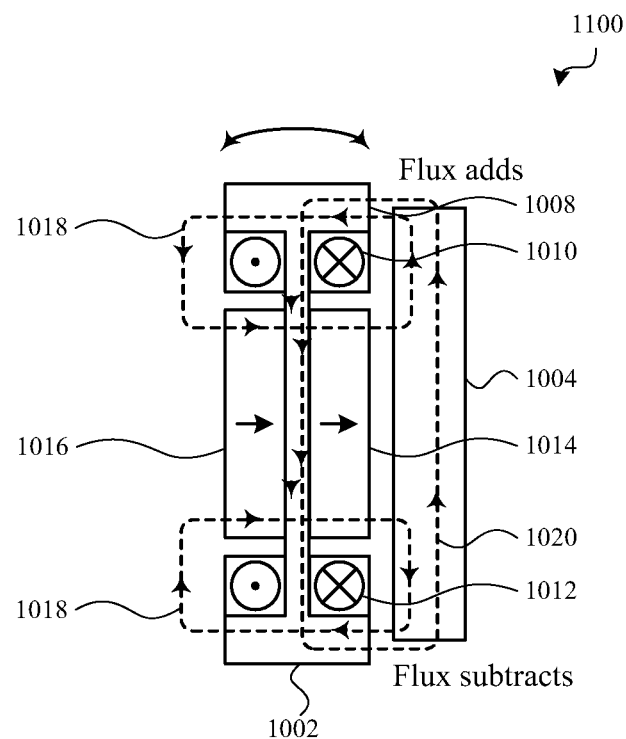

FIGS. 11A & 11B show a haptic engine 1100 that is similar to the haptic engine 1000 described with reference to FIGS. 10A & 10B, but without the second stator 1006.

Figure 12A:
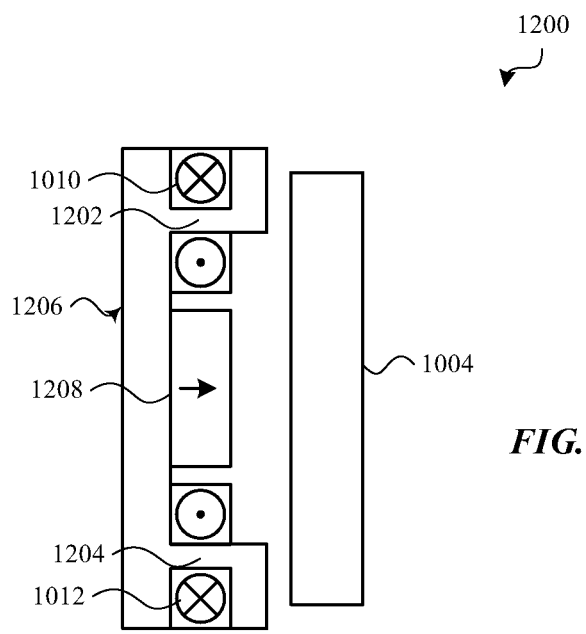

FIG. 12A shows a haptic engine 1200 that is similar to the haptic engine 1100, but with the coils 1010, 1012 wound around perpendicular extensions 1202, 1204 from a core 1206, such that the coils 1010, 1012 are planar to one another. A single permanent magnet 1208 may be attached to a surface of the core 1206, between the coils 1010, 1012.

Figure 12B:
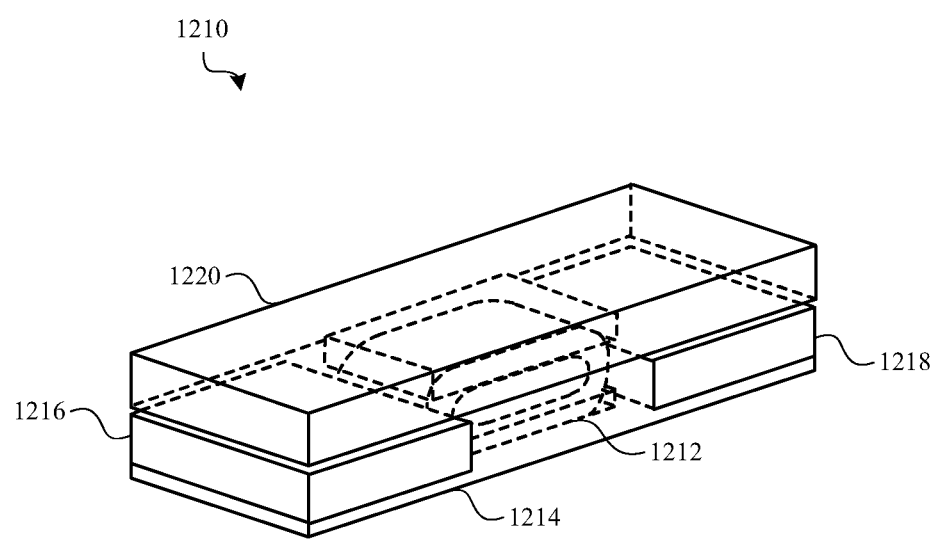

FIG. 12B shows a haptic engine 1210 that is similar to the haptic engine 1200 described with reference to FIG. 12A, but with a singular coil 1212 wound around an extension of the core 1214, and permanent magnets 1216, 1218 attached to the core 1214 on opposite sides of the coil 1212. The haptic engine 1210 includes a single stator 1220.

Figure 12C:
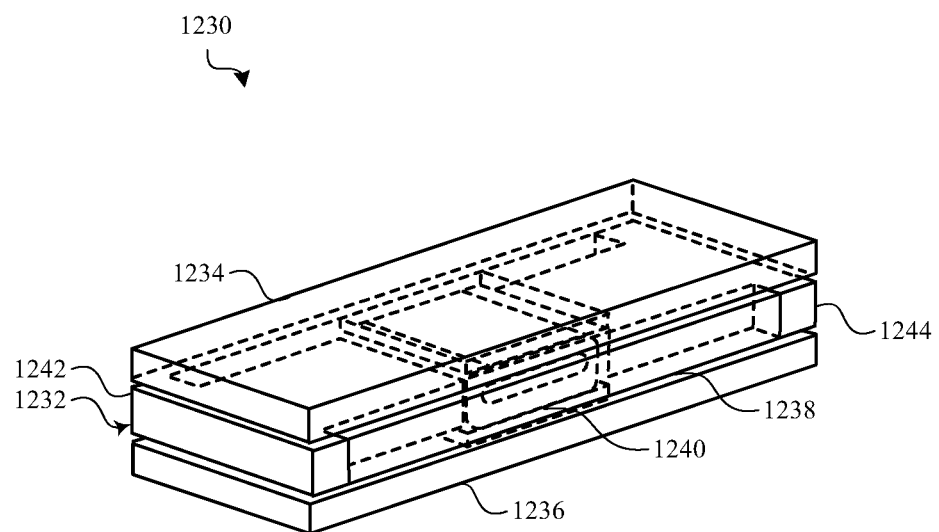

FIG. 12C shows a haptic engine 1230 having a rotor 1232 positioned between first and second stators 1234, 1236. The rotor 1232 includes an H-shaped core 1238 in which the H-profile of the core 1238 extends planar to the first and second stators 1234, 1236. A coil 1240 is wound around the middle portion of the H-profile, and permanent magnets 1242 and 1244 are attached to the H-shaped core 1238 within upper and lower voids of the H-shaped profile.

Figure 12D:
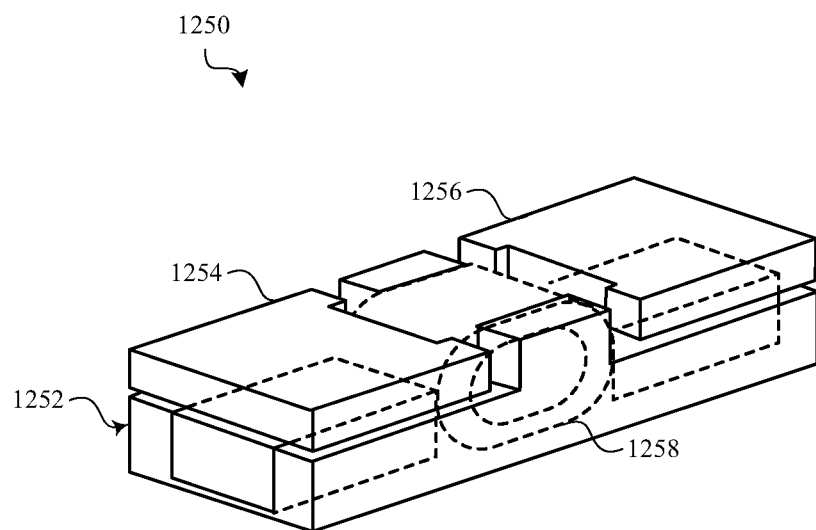

FIG. 12D shows a haptic engine 1250 having a rotor 1252 positioned adjacent a pair of planar stators 1254, 1256. The rotor 1252 may be configured similarly to the rotor shown in FIG. 12B, but in some cases may have a larger coil 1258 that extends between stators 1254, 1256.

Figure 12E:
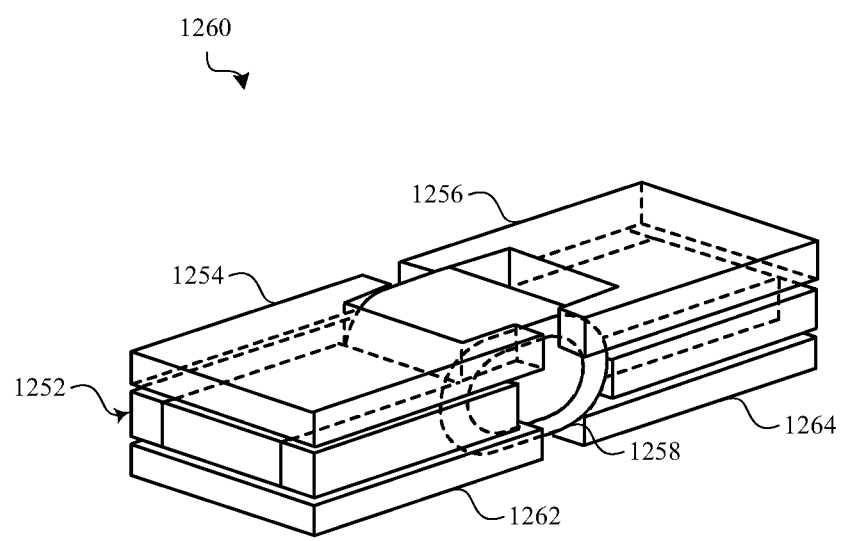

FIG. 12E shows a haptic engine 1260 that is similar to the haptic engine 1250 described with reference to FIG. 12D, but with a second pair of planar stators 1262, 1264 positioned on a side of the rotor 1252 opposite the first pair of planar stators 1254, 1256. The coil 1258 may also extend between the stators 1262 and 1264.

In alternative embodiments of the haptic engines described with reference to FIGS. 10A-12E, the core of a rotor may be less H-shaped or non-H-shaped, and one or more stators may be C-shaped and extend at least partially around the rotor. In some embodiments, only a single coil and a single permanent magnet may be included on a rotor. Alternatively, one or more coils or permanent magnets may be positioned on a stator, instead of or in addition to one or more coils or permanent magnets positioned on a rotor.

Figure 13A:
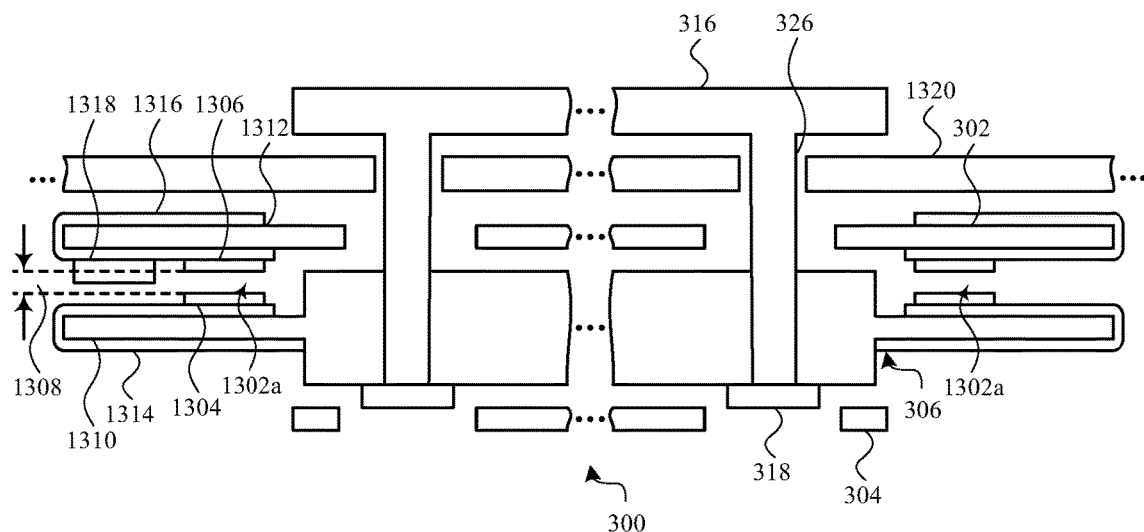
FIG. 13A shows a cross-section of the components described with reference to FIG. 3, with an alternative force sensor.

FIG. 13A shows a cross-section of the components described with reference to FIG. 3, but for the constraint (which may be included in a module including the components shown in FIG. 13A, but which is not shown in FIG. 13A). The components include the haptic engine 300 (e.g., the rotor 306 positioned between first and second stators 302, 304). In some embodiments, the haptic engine 300 may be further configured as described with reference to any of FIGS. 3-12E. In contrast to the force sensor 336 shown in FIG. 3, the components shown in FIG. 13A include a capacitive force sensor 1302 that is at least partially attached to the haptic engine 300. FIG. 13A also shows the button 316 described with reference to FIG. 3, with its legs 326 inserted through a housing 1320 (e.g., a sidewall of a device) and attached to the rotor 306 by screws 318. The capacitive force sensor 1302 may be configured to sense a force applied to the button 316, and thereby to the rotor 306, in response to user or other interaction with the button 316 (e.g., the capacitive force sensor 1302 may sense a force that is applied to the button 316 parallel to a rotor-to-stator gap, or a force applied to the button 316 which has a force component parallel to the rotor-to-stator gap).

By way of example, the capacitive force sensor 1302 is shown to include two force sensing elements 1302a, each of which may be similarly configured. The two force sensing elements 1302a may be positioned at different locations relative to a user interaction surface of the button 316. As shown, the two force sensing elements 1302a may be spaced apart along the housing 1320, at opposite ends of the haptic engine 300. In alternative embodiments, the capacitive force sensor 1302 may include more force sensing elements (e.g., 3-4 force sensing elements, or 3-8 force sensing elements) or fewer force sensing elements (e.g., one force sensing element). In the case of three or more force sensing elements, the force sensing elements may be positioned in a one-dimensional array or two-dimensional array with respect to the user interaction surface of the button 316.

Each force sensing element 1302a may include a set of electrodes 1304, 1306, and each set of electrodes may include a first electrode 1304 attached to the rotor 306, and a second electrode 1306 attached to one of the stators (e.g., the first stator 302) and separated from the first electrode 1304 by a capacitive gap 1308. In some embodiments, the first electrode 1304 may be attached to an extension 1310 of the rotor's core, on a side of the core that faces the first stator 302; and the second electrode 1306 may be attached to an extension 1312 of the first stator 302, on a side of the first stator 302 that faces the rotor 306.

In some cases, the first electrode 1304 may be attached to or included in a first flex circuit 1314 (or printed circuit board) attached to the core, and the second electrode 1306 may be attached to or included in a second flex circuit 1316 (or printed circuit board) attached to the first stator 302. By way of example, the first flex circuit 1314 may carry power, ground, or other electrical signals to the first electrode 1304, as well as to the rotor 306. For example, the first flex circuit 1314 may carry an electrical signal (e.g., power) to a coil (or coils) attached to the rotor 306, to stimulate the haptic engine 300 to provide a haptic output. Also by way of example, the second flex circuit 1316 may carry power, ground, or other electrical signals to the second electrode 1306, as well as to a controller, processor, or other circuit 1318 coupled to the second flex circuit 1316. Alternatively, the circuit 1318 may be coupled to the first flex circuit 1314, or to both flex circuits 1314, 1316. The second flex circuit 1316 may also carry electrical signals away from the second electrode 1306 or circuit 1318, or couple the second electrode 1306 to the circuit 1318. The first and second flex circuits 1314, 1316 may electrically isolate the first and second electrodes 1304, 1306 from the core and first stator 302.

The first flex circuit 1314 may be adhesively bonded, clipped, or otherwise attached to the rotor core. The second flex circuit 1316 may be adhesively bonded, clipped, or otherwise attached to the first stator 302.

In some embodiments, the circuit 1318 may be used to detect or measure a capacitance of the second electrode 1306 of each force sensing element 1302a, and provide an indication of whether a force applied to the button 316 is detected. In some cases, the first electrode 1304 may be driven with an electrical signal as the capacitance of the second electrode 1306 is measured. The circuit 1318 may also or alternatively indicate a value of a capacitance of the second electrode 1306, which value may be routed to an off-module controller, processor, or other circuit via the second flex circuit 1316. In some embodiments, the circuit 1318 or an off-module circuit may use the different outputs of different force sensing elements (e.g., outputs of the two force sensing elements 1302a shown in FIG. 13A) to determine an amount of force applied to the button 316 or a location of a force applied to the button 316 (i.e., a force location). For example, measurements provided by different force sensing elements may be averaged or otherwise combined to determine an amount of force; or measurements provided by different force sensing elements, in combination with the locations of the force sensing elements with respect to a surface of the button, can be used to determine a force location. In some embodiments, the circuit 1318 may provide a pattern of capacitances to the off-module circuit. The pattern of capacitances may indicate a type of force input to the button 316 (e.g., a particular command or input). The pattern of capacitances (or force pattern) provided by the circuit 1318 may be timing insensitive, or may include a pattern of capacitances sensed within a particular time period, or may include a pattern of capacitances and an indication of times between the capacitances.

The signals carried by the first or second flex circuit 1314, 1316 may include analog and/or digital signals (e.g., analog or digital indications of the presence, amount, or location of a force may be provided via analog and/or digital signals).

In some embodiments, the first and second flex circuits 1314, 1316 may be electrically coupled, and the circuit 1318 may provide an electrical signal to the haptic engine 300, to stimulate the haptic engine 300 to provide a haptic output, in response to detecting the presence of a force on the button 316 (or in response to determining that a particular amount of force, location of force, or pattern of force has been applied to the button 316). The circuit 1318 may provide a single type of electrical signal or haptic actuation waveform to the haptic engine 300 in response to determining that a force, or a particular type of force, has been applied to the button 316. Alternatively, the circuit 1318 may identify a haptic actuation waveform associated with a particular type of force applied to the button 316, and apply the identified haptic actuation waveform to the haptic engine 300 (e.g., to produce different types of haptic output in response to determining that different types of force have been applied to the button 316). In some embodiments, different haptic actuation waveforms may have different amplitudes, different frequencies, and/or different patterns.

FIG. 13A shows an example arrangement of flex circuits 1314, 1316 in which the first flex circuit 1314 wraps around each of opposite ends of the rotor core, and the second flex circuit 1316 wraps around each of opposite ends of the first stator 302. The portions of the first flex circuit 1314 shown at the left and right of FIG. 13A may be connected by another portion of the first flex circuit 1314 that extends between the two end portions. In some cases, the portion of the first flex circuit 1314 that connects the two end portions may be bent or folded to extend perpendicularly to the two end portions (and in some cases, the folded portion may connected to an off-module circuit). The portions of the second flex circuit 1316 shown in FIG. 13A may be connected similarly to how the portions of the first flex circuit 1314 are connected, and may also be connected to an off-module circuit.

Figure 13B:
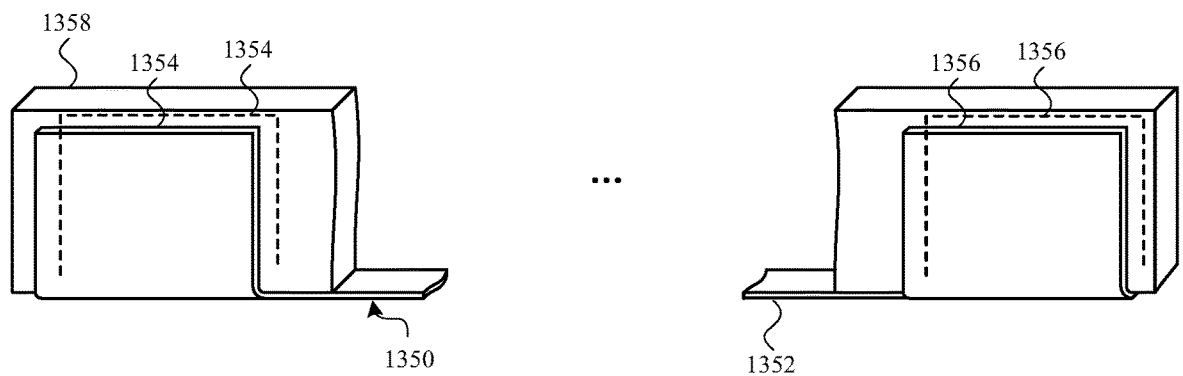
FIG. 13B shows an alternative way to wrap a flex circuit around the rotor core (or alternatively the first stator) described with reference to FIG. 13A.

FIG. 13B shows an alternative way to wrap a flex circuit around the rotor core 1358 (or alternatively the first stator 302) described with reference to FIG. 13A. As shown, the flex circuit 1350 may include a central portion 1352 that connects pairs of tab portions 1354, 1356 at opposite ends of the central portion 1352. One pair of tab portions 1354 extends perpendicularly from the central portion 1352, over first and second opposite faces of the rotor core 1358, near one end of the rotor core 1358. Another pair of tab portions 1356 extends perpendicularly from the central portion 1352, over the first and second opposite faces of the rotor core 1358, near an opposite end of the rotor core 1358. The flex circuit 1350 may be adhesively bonded, clipped, or otherwise attached to the rotor core 1358.

In alternative flex circuit arrangements, a flex circuit may be attached to the rotor or stator without wrapping the flex circuit around the rotor or stator. However, wrapping a flex circuit around a rotor core may provide a flex circuit surface for coil lead connections, if needed, or may increase the flex service loop length and flexibility, if needed. In some embodiments, the rotor and stator flex circuits may be coupled by a hot bar or other element.

Figure 14A:
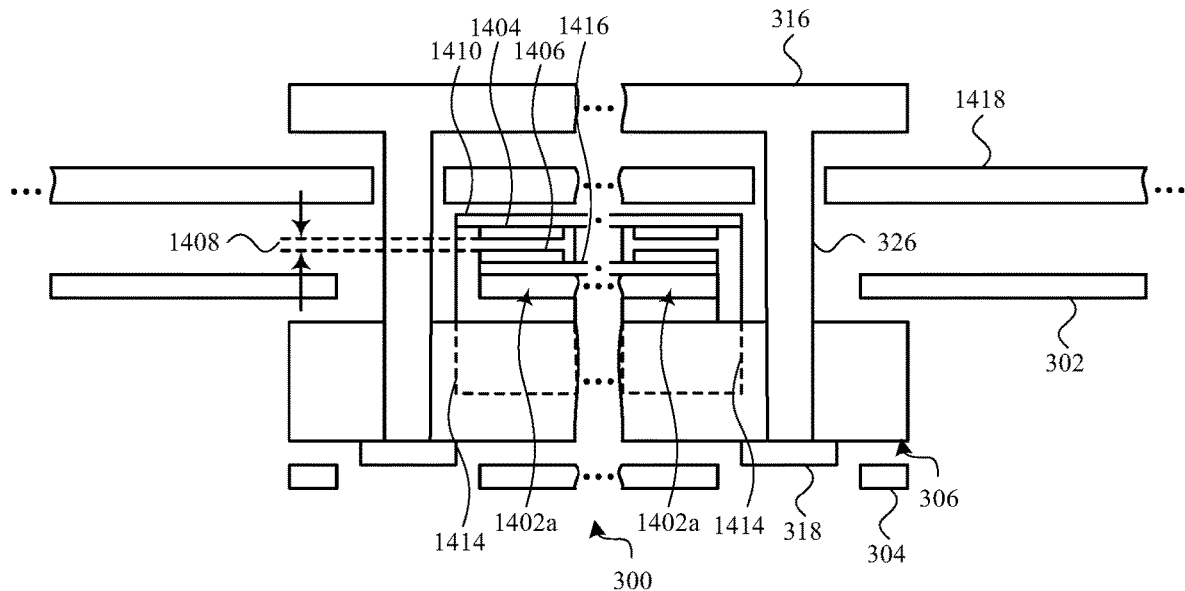
FIG. 14A shows another cross-section of the components described with reference to FIG. 3, with another alternative force sensor.

FIG. 14A shows another cross-section of the components described with reference to FIG. 3, but for the constraint (which may be included in a module including the components shown in FIG. 14A, but which is not shown in FIG. 14A). The components include a haptic engine (e.g., a rotor positioned between first and second stators). The components include the haptic engine 300 (e.g., the rotor 306 positioned between first and second stators 302, 304). In some embodiments, the haptic engine 300 may be further configured as described with reference to any of FIGS. 3-12E. The components shown in FIG. 14A also include a capacitive force sensor 1402 that is at least partially attached to the haptic engine 300. FIG. 14A also shows the button 316 described with reference to FIG. 3, with its legs 326 inserted through a housing 1418 (e.g., a sidewall of a device) and attached to the rotor 306 by screws 318. The capacitive force sensor 1402 may be configured to sense a force applied to the button 316, and thereby to the rotor 306, in response to user or other interaction with the button 316 (e.g., the capacitive force sensor 1402 may sense a force that is applied to the button 316 parallel to a rotor-to-stator gap, or a force applied to the button 316 which has a force component parallel to the rotor-to-stator gap).

By way of example, the capacitive force sensor 1402 is shown to include two force sensing elements 1402a, each of which may be similarly configured. The two force sensing elements 1402a may be positioned at different locations relative to a user interaction surface of the button 316. As shown, the two force sensing elements 1402a may be spaced apart along the housing 1418, at opposite ends of the haptic engine 300. In alternative embodiments, the capacitive force sensor 1402 may include more force sensing elements (e.g., 3-4 force sensing elements, or 3-8 force sensing elements) or fewer force sensing elements (e.g., one force sensing element). In the case of three or more force sensing elements, the force sensing elements may be positioned in a one-dimensional array or two-dimensional array with respect to the user interaction surface of the button 316.

Each force sensing element 1402a may include a set of electrodes 1404, 1406, and each set of electrodes may include a first electrode 1404 attached to the rotor 306, and a second electrode 1406 attached to one of the stators (e.g., the first stator 302) and separated from the first electrode 1404 by a capacitive gap 1408. In some embodiments, the first electrode 1404 may be attached to a flex circuit 1410 or clip connected (e.g., adhesively bonded or clipped) to the rotor's core, and the second electrode 1406 may be attached to the first stator 302, on a side of the first stator 302 that faces the rotor 306.

Figure 14B:
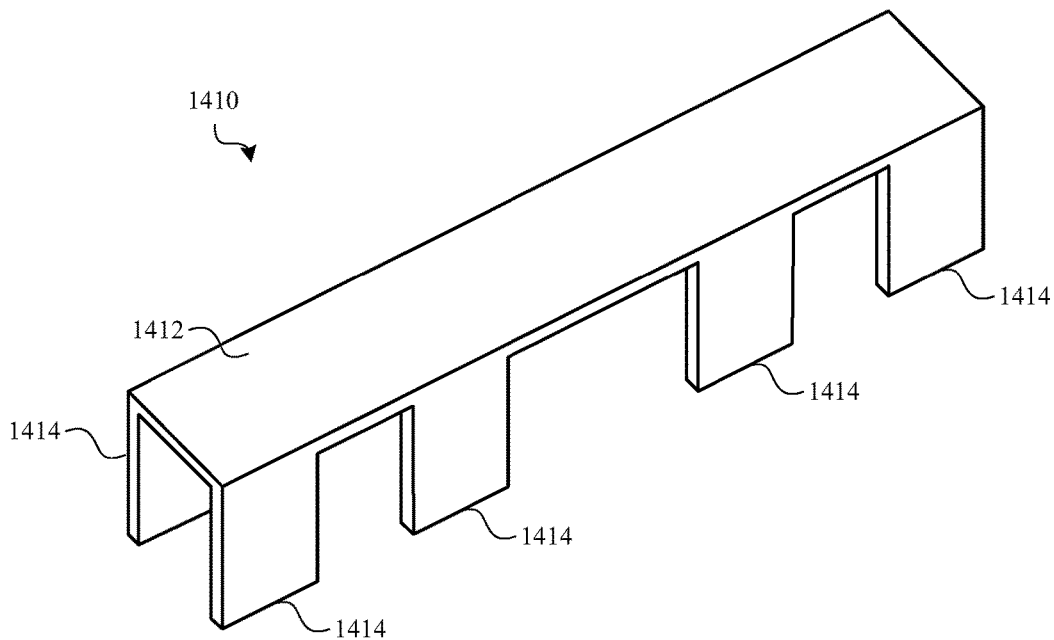
FIG. 14B shows an isometric view of a flex circuit used to implement the force sensor described with reference to FIG. 14A.

In some cases, the flex circuit 1410 or clip to which the first electrode 1404 is attached may include a central portion 1412 that faces the button 316, and arms 1414 that extend perpendicularly from the central portion 1412 and are attached to the rotor 306 (e.g., to its core), as shown in FIGS. 14A & 14B. The second electrode 1406 may be attached to or included in a second flex circuit 1416 (or printed circuit board) attached to the first stator 302. By way of example, the flex circuits 1410, 1416 may carry power, ground, or other electrical signals similarly to the first and second flex circuits 1314, 1316 described with reference to FIG. 13A.

In some embodiments, a circuit may be electrically coupled to one or both of the flex circuits 1410, 1416 and used to detect or measure a capacitance of the second electrode 1406 of each of the force sensing elements, and provide an indication of whether a force applied to the button 316 is detected. The circuit may also or alternatively indicate a value of a capacitance of the second electrode 1406, which value may be routed to an off-module controller, processor, or other circuit via the second flex circuit 1416. In some embodiments, the circuit or an off-module circuit may use the different outputs of different force sensing elements (e.g., outputs of the two force sensing elements 1402a shown in FIG. 14A) to determine an amount of force applied to the button 316 or a location of a force applied to the button 316 (i.e., a force location). In some embodiments, the circuit may provide a pattern of capacitances to the off-module circuit. The pattern of capacitances may indicate a type of force input to the button 316 (e.g., a particular command or input). The pattern of capacitances (or force pattern) provided by the circuit may be timing insensitive, or include a pattern of capacitances sensed within a particular time period, or include a pattern of capacitances and an indication of times between the capacitances.

The signals carried by the flex circuits 1410, 1416 may include analog and/or digital signals (e.g., analog or digital indications of the presence, amount, or location of a force may be provided via analog and/or digital signals).

In some embodiments, the flex circuits 1410, 1416 may be electrically coupled, and a circuit coupled to the flex circuits 1410, 1416 may provide an electrical signal to the haptic engine 300, to stimulate the haptic engine to provide a haptic output, in response to detecting the presence of a force on the button 316 (or in response to determining that a particular amount of force, location of force, or pattern of force has been applied to the button 316). The circuit may provide one or more haptic actuation waveforms as described with reference to FIG. 13A.

A capacitive force sensor may additionally or alternatively include other types of force sensing elements in which a first electrode of the force sensing element is attached to a movable portion of a module, and a second electrode of the force sensing element is attached to a stationary portion of the module and separated from the first electrode by a capacitive gap. The force sensing elements may be positioned within or outside a stator-to-rotor gap.

Figure 15:
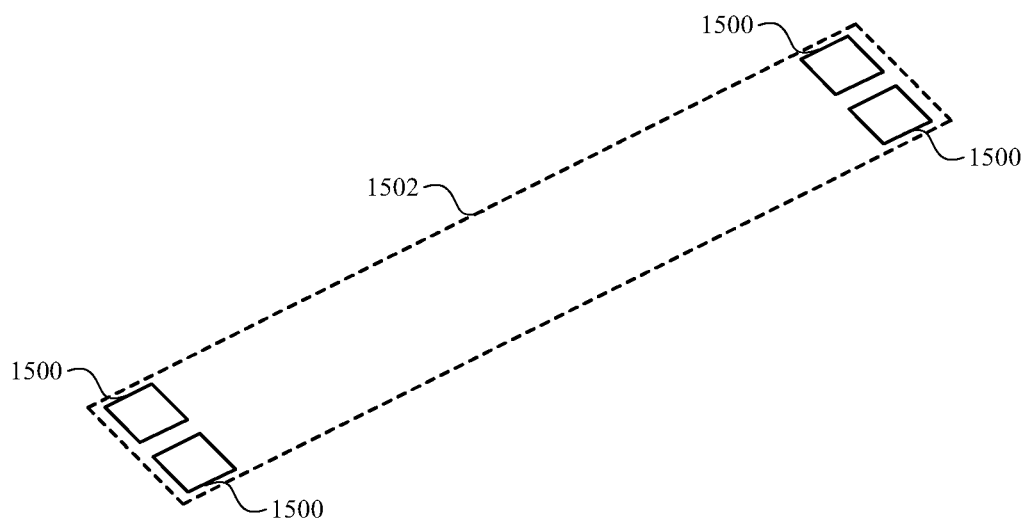
FIG. 15 shows an example two-dimensional arrangement of force sensing elements.

FIG. 15 shows an example two-dimensional arrangement of force sensing elements 1500, which force sensing elements 1500 may be incorporated into the force sensor described with reference to FIG. 13A or 14A, or into other force sensors. The example arrangement shown in FIG. 15 includes four force sensing elements 1500 disposed near the corners of a haptic engine (or near the corners of a button's user interaction surface). The force sensing elements 1500 may alternatively be distributed uniformly across a surface or volume 1502. A two-dimensional array of force sensing elements 1500 can be used to determine what portion of a button is pressed, or to sense the components of a force applied in different directions (e.g., a side-to-side movement as might be provided to a ringer on/off switch). A one-dimensional array of force sensing elements 1500 can also be used to determine what portion of a button is pressed, but only along one button axis. In some embodiments, only three of the force sensing elements 1500 may be provided, or the force sensing elements 1500 may be disposed in different positions.

Figure 16A:
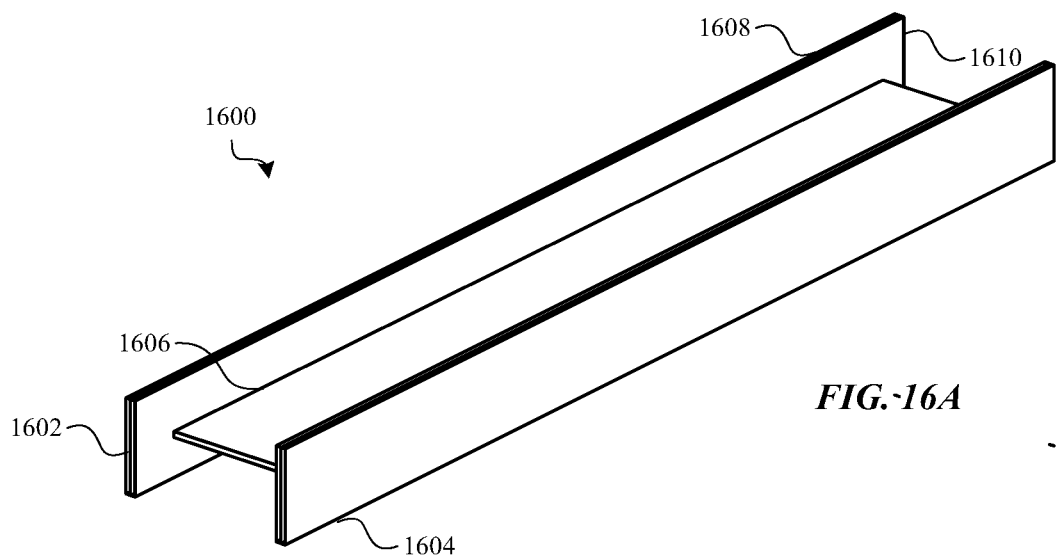
FIGS. 16A-16C, there are shown alternative configurations of a rotor core.
Figure 16B:
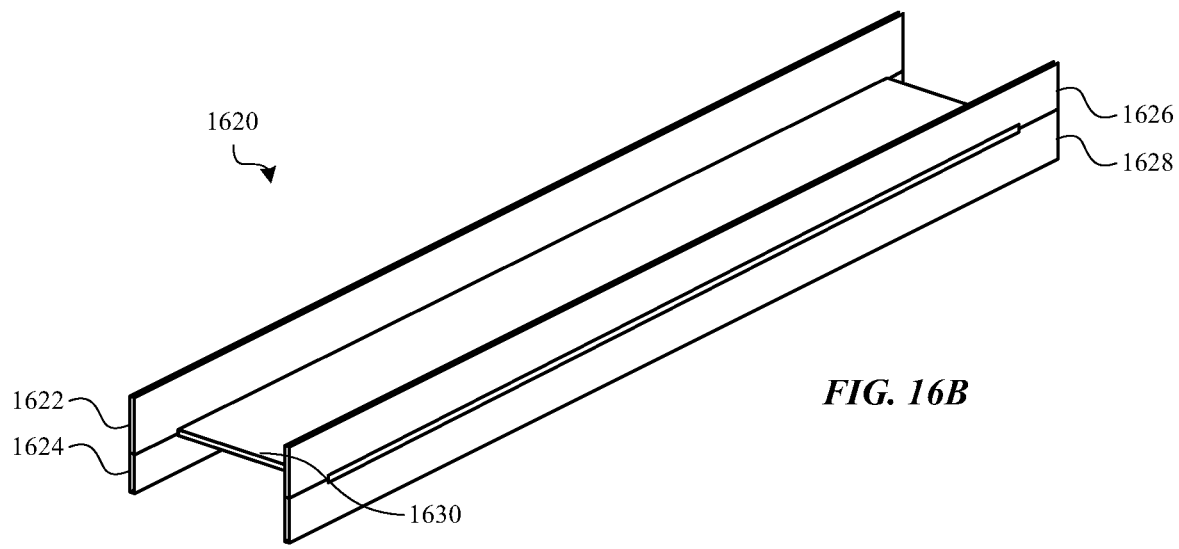
Figure 16C:
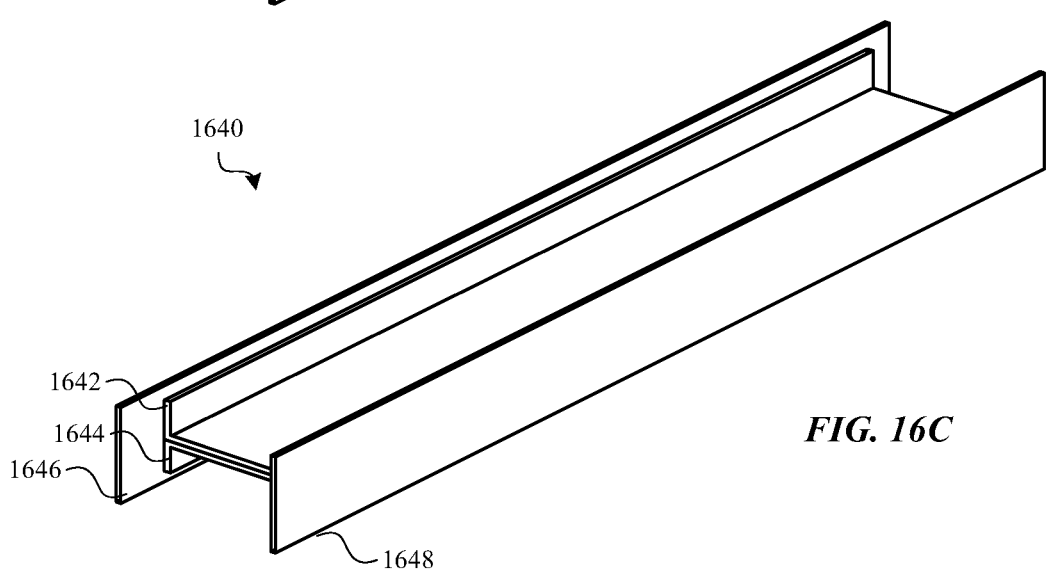

Turning now to FIGS. 16A-16C, there are shown alternative configurations of a rotor core. As shown in FIG. 16A, a rotor core 1600 may include a first rigid plate 1602 and a second rigid plate 1604 having opposing surfaces joined by a third rigid plate 1606 to form an H-shaped core 1600. In some embodiments, a first pair of plates 1608, 1610 may be stacked and welded to form the first rigid plate 1602, and a second pair of plates may be stacked and welded to form the second rigid plate 1604. In some embodiments, a third pair of plates may be stacked and welded to form the third rigid plate 1606 (not shown).

FIG. 16B shows an alternative rotor core 1620. As shown in FIG. 16B, a first pair of plates 1622, 1624 may be positioned side-by-side and welded together such that first slot is formed between the plates 1622, 1624 of the first pair. A second pair of plates 1626 1628 may also be positioned side-by-side and welded together such that a second slot is formed between the plates 1626, 1628 of the second pair. Opposite sides of a fifth plate 1630 may be inserted into the respective first and second slots, and the first and second pairs of plates 1622/1624, 1626/1628 may be welded to the opposite sides of the fifth plate 1630.

FIG. 16C shows another alternative rotor core 1640. As shown in FIG. 16C, a first plate 1642 may have opposite side portions that are bent perpendicularly to a central portion of the first plate 1642. A second plate 1644 may be formed similarly to the first plate 1642, stacked on the first plate 1642, and welded to the first plate 1642 such that corresponding side portions of the first and second plates 1642 1644 extend in opposite directions. A third plate 1646 may be welded to a first set of corresponding side portions of the first and second plates 1642, 1644, and a fourth plate 1648 may be welded to a second set of corresponding side portions of the first and second plates 1642 1644.

Any of the plates described with reference to FIGS. 16A-16C may include one plate or a set of two or more stacked plates.

Figure 17A:
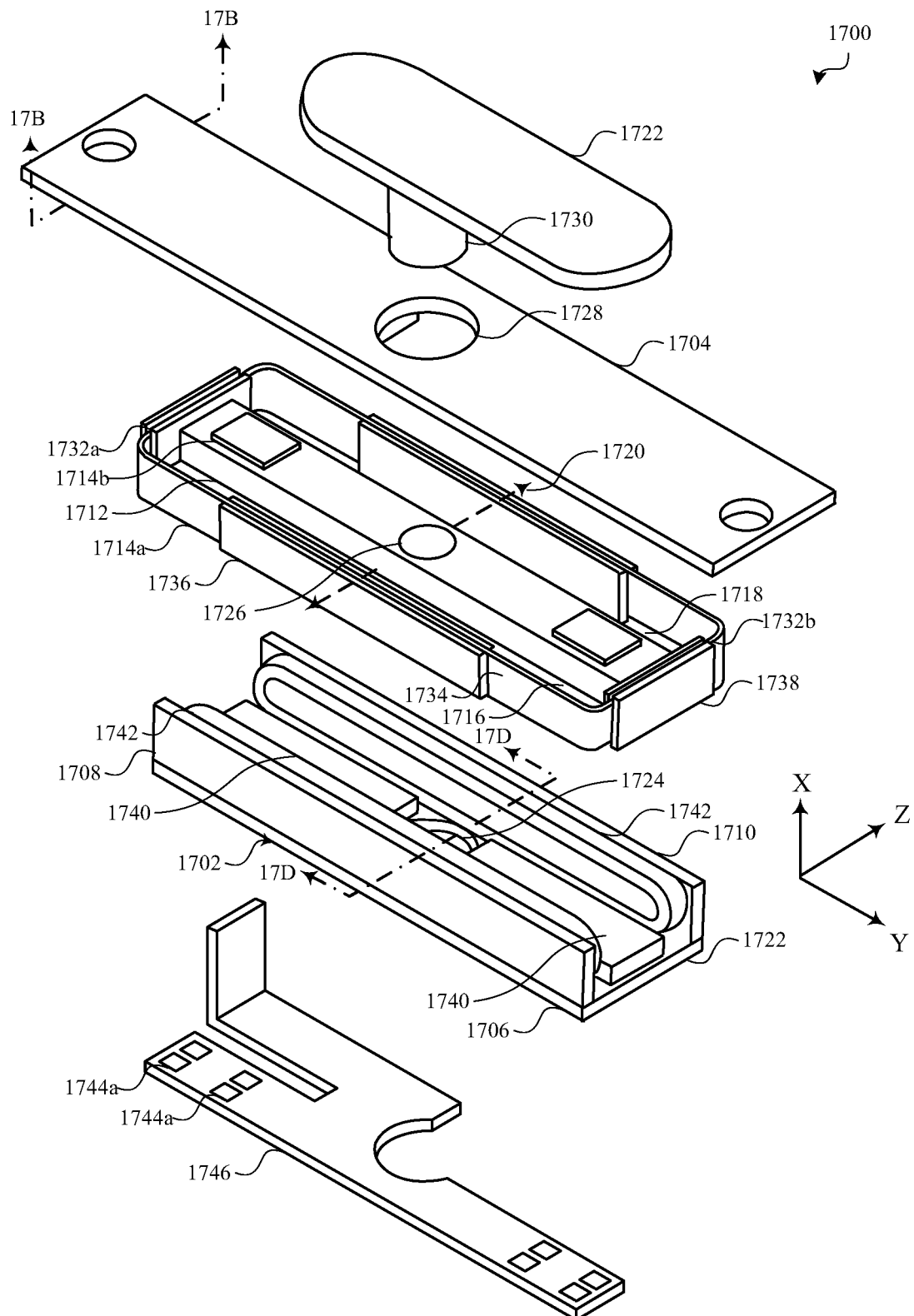
FIGS. 17A-17D show another example haptic engine.
Figure 17B:
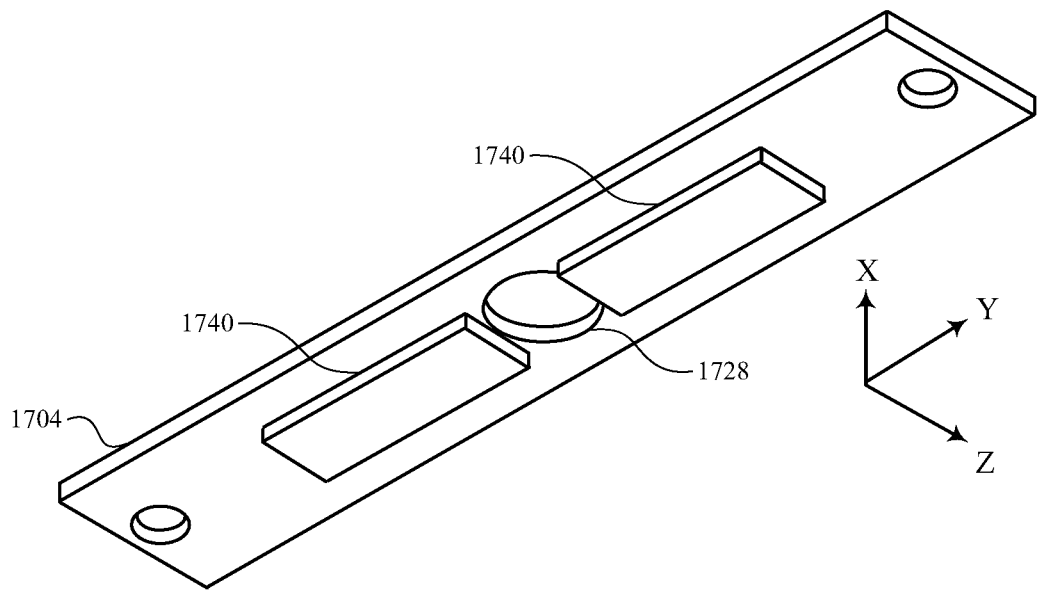
Figure 17C:
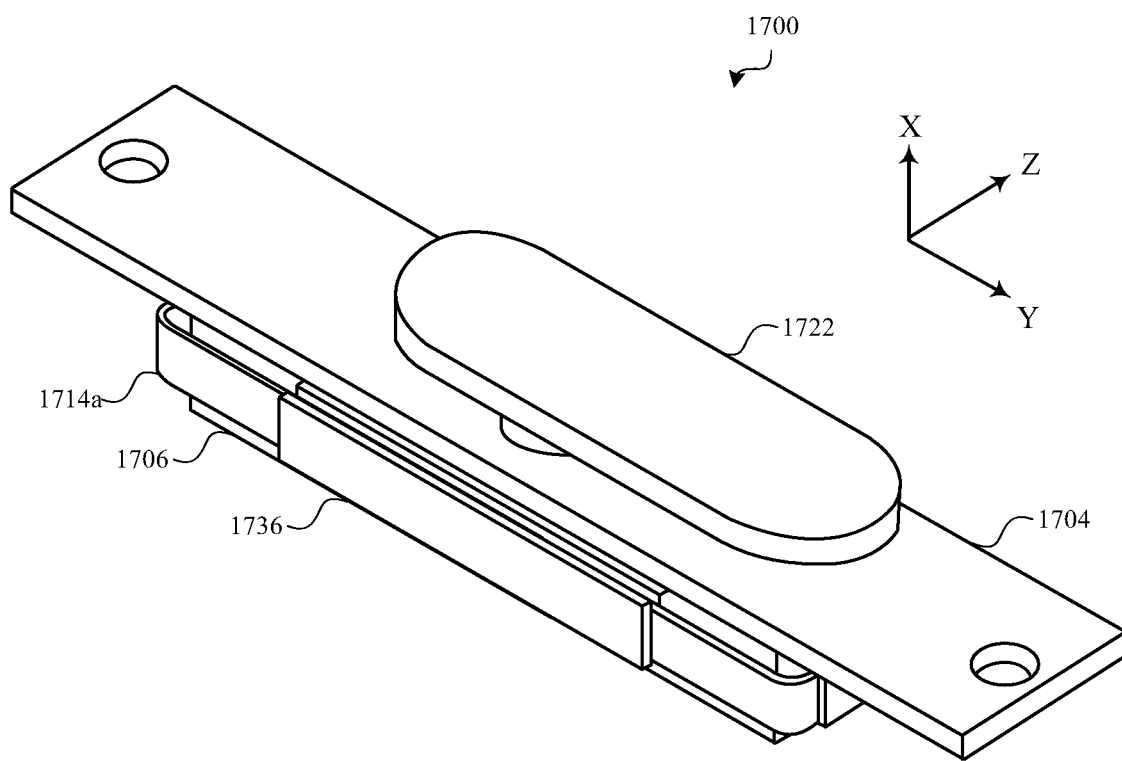
Figure 17D:
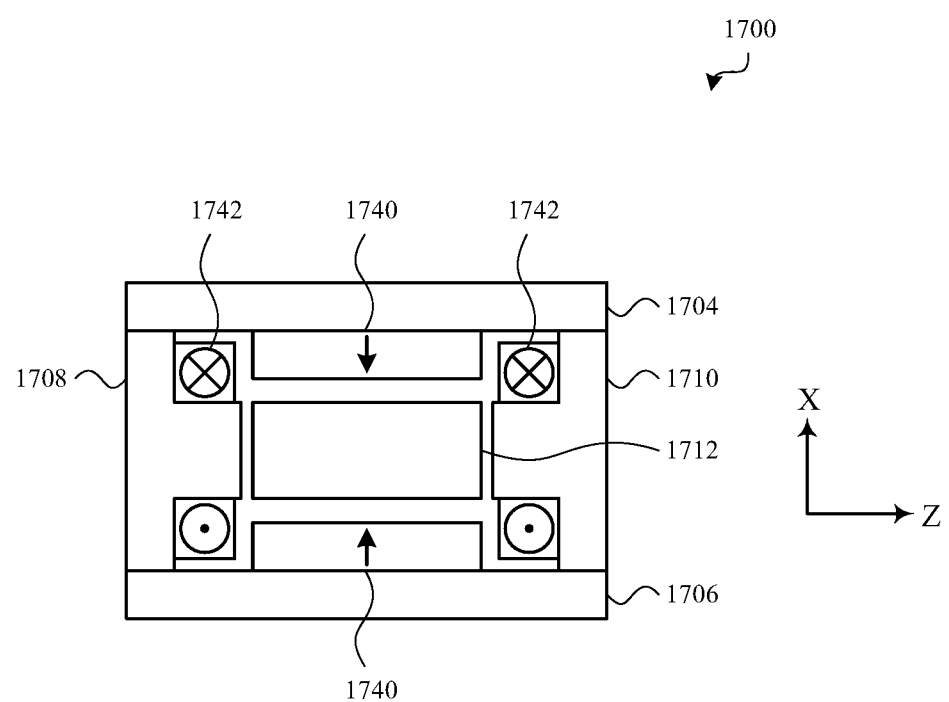

FIGS. 17A-17D show another example haptic engine 1700 (or button assembly). FIG. 17A shows an exploded isometric view of the haptic engine 1700. FIG. 17B shows an isometric view of an inner surface of a first component 1704 of a stator 1702 of the haptic engine 1700. FIG. 17C shows an assembled version of the haptic engine 1700. FIG. 17D shows an assembled cross-section of the haptic engine 1700. The haptic engine 1700 is an example of the haptic engine included in the button base 206 described with reference to FIGS. 2A & 2B, and in some cases may be a permanent magnet biased electromagnetic haptic engine (or a permanent magnet biased normal flux electromagnetic haptic engine).

The haptic engine 1700 may include one or more stationary portions and one or more movable portions, in addition to a constraint 1714 that is configured to constrain movement of the movable portion(s) relative to the stationary portion(s) and bias the movable portion(s) toward a rest position in which the movable portion(s) are separated from the stationary portion(s) by one or more gaps. By way of example, the stationary portion(s) may include a ferritic stator 1702 including a set of two or four components (e.g., walls) 1704, 1706, 1708, 1710 defining a channel, and the movable portion(s) may include a ferritic shuttle 1712 that is positioned in and movable within the channel. When the components of the haptic engine 1700 are assembled, the shuttle 1712 may be separated from a first component 1704 of the stator 1702 by a first gap 1716 (e.g., a first shuttle-to-stator gap), and from a second component 1706 of the stator 1702 by a second gap 1718 (e.g., a second shuttle-to-stator gap). The shuttle 1712 may be configured to move linearly (e.g., translate along an axis 1720 that perpendicularly intersects the first and second components 1704, 1706 of the stator 1702. The constraint 1714 may constrain closure of the first and second gaps 1716, 1718 and bias the shuttle 1712 toward a rest position in which the shuttle 1712 is separated from the first and second components 1708, 1710 of the stator 1702 by the first and second gaps 1716, 1718. The shuttle 1712 may be magnetically attracted to one or the other of the first and second components 1708, 1710 of the stator 1702, and may contact (e.g., crash against) the stator 1702 in the absence of the constraint 1714.

A button 1722 may be mechanically coupled to the haptic engine 1700. For example, a button 1722 may be mechanically coupled to the shuttle 1712 such that movement of the shuttle 1712 may provide a haptic output to the button 1722. In some cases, the button 1722 may be attached to the shuttle 1712 by a screw that passes through holes 1724, 1726, 1728 in the second component 1706 of the stator 1702, the shuttle 1712, and the first component 1704 of the stator 1702. The screw may be received by a threaded insert in a leg 1730 (or other button attachment member) of the button 1722, and a head of the screw may bear against a surface of the shuttle 1712.

In some embodiments, the constraint 1714 may include one or more flexures 1714a. Although two flexures 1714a are shown in FIG. 17A, only one flexure 1714a may be included in some embodiments. Each flexure 1714a may have shuttle attachment portions 1732a, 1732b on either side of a stator attachment portion 1734. The stator attachment portion 1734 of each flexure may extend along one side of a pair of opposite sides, and may be spaced apart from the shuttle 1712 (e.g., by a gap 1716 or gap 1718). An assembly including the flexures 1714a and the shuttle 1712 may be combined with the stator 1702 by positioning the third and fourth components 1708, 1710 of the stator 1702 within the gaps 1716, 1718. The third and fourth components 1708, 1710 may only partially fill the gaps 1716, 1718, thereby leaving space for the shuttle 1712 to translate. The stator attachment portion 1734 of one flexure 1714a may be attached to the third component 1708 of the stator 1702, and the stator attachment portion 1734 of the other flexure 1714a may be attached to the fourth component 1710 of the stator 1702. In some embodiments, a clamp 1736 (e.g., a stiffening clamp) may be welded or otherwise attached to the stator attachment portion 1734 of a flexure 1714a and used to limit the flex of the flexure 1714a along the stator attachment portion 1734. More generally, the flexure 1714a may extend in a direction transverse to a direction of linear movement of the shuttle 1712, and may be spaced apart from a first side of the shuttle 1712 that is transverse to the direction of linear movement. The flexure 1714a may connect at least one side of the shuttle 1712, other than the first side, to the stator 1702.

The shuttle attachment portions 1732a, 1732b (e.g., one or more arms or extensions extending from the stator attachment portion 1734) of a flexure 1714a may be attached to opposite sides or ends of the shuttle 1712, along an axis transverse to the axis 1720 along which the shuttle 1712 translates. In some embodiments, the shuttle attachment portions 1732a or 1732b of different flexures 1714a, which shuttle attachment portions 1732a or 1732b are attached to a same end of the shuttle 1712, may be mechanically coupled by a clamp 1738 (e.g., a stiffening clamp).

The flexure 1714a may constrain movement of the shuttle 1712 to translation movement along the axis 1720, and may provide a linearly consistent stiffness opposing the translation movement. In some cases, the flexures 1714a may be metal flexures. Each of the flexures 1714a may function similarly to the flexure 314a described with reference to FIG. 3.

As another example, the constraint 1714 may alternatively or additionally include a set of one or more elastomers (e.g., one or more elastomeric pads, such as silicone pads) or other compliant material(s) 1714b. The compliant material(s) 1714b may be disposed (positioned) between the first component 1704 of the stator 1702 and the shuttle 1712, and/or between the second component 1706 of the stator 1702 and the shuttle 1712. The compliant material(s) 1714b may constrain movement of the shuttle 1712 and bias the shuttle 1712 toward a rest position that maintains the gaps 1716 and 1718. The compliant material(s) 1714b may also damp movement of the shuttle 1712. In some cases, the compliant material(s) 1714b may be adhesively bonded to the component 1704 or 1706 of the stator 1702 and the shuttle 1712.

In some cases, the compliant material(s) 1714b may be distributed in a two or three-dimensional array.

Each of the flexure 1714a and/or the compliant material(s) 1714b may be configured to provide a first stiffness opposing the linear movement of the shuttle 1712, and a second stiffness opposing a force applied to the button 1722 (i.e., asymmetric first and second stiffnesses). This can enable the stiffnesses to be individually adjusted (e.g., to separately tune the force input and haptic output user experiences for the button 1722).

By way of example, and as shown in FIGS. 17A, 17B, & 17D, the haptic engine 1700 may include one or more permanent magnets 1740 (e.g., two permanent magnets 1740) mounted to one or each of the first and second housing components 1704, 1706 of the stator 1702, and one or more coils 1742 wound around an inward extension of one or more of the third and fourth components 1708, 1710 of the stator 1702. By way of example, the permanent magnets 1740 may be disposed on first opposite sides of the shuttle 1712, in planes parallel to the axis 1720 along which the shuttle 1712 translates. Each of the permanent magnets 1740 may be magnetized toward the shuttle 1712, with the permanent magnets 1740 on one side of the shuttle 1712 opposing the permanent magnets 1740 on the other side of the shuttle 1712. Also by way of example, the coils 1742 may be disposed on second opposite sides of the shuttle 1712 and wound in planes that bisect the axis 1720 along which the shuttle 1712 translates. The coils 1742 may be electrically connected in series or in parallel. A parallel connection of the coils 1742 may provide a reduction in the total resistance of the coils 1742, and/or may enable the use of a thinner wire to achieve the same resistance as a series connection of the coils 1742. In some alternative embodiments, permanent magnets may be positioned on two or four sides of the shuttle 1712. In the case of four permanent magnets, the sides that include the permanent magnets would not be used for the coils. In some alternative embodiments, the coils may be combined on one side of the shuttle 1712. The permanent magnets may be attached to the stator or the shuttle. When the coils 1742 are stimulated by an electrical signal (e.g., a current), the flux of a magnetic bias field created by the permanent magnets may be selectively increased, and the shuttle 1712 may overcome the biasing forces of the constraints 1714 and translate along the axis 1720. The flux is "selectively" increased in that it is increased on some faces of the shuttle 1712 and decreased on opposing faces, resulting in an increased net translational force that provides or increases a force along the axis 1720 of the shuttle 1712. In alternative embodiments of the haptic engine 1700, one or more permanent magnets and coils may be positioned about (or on) the shuttle 1712 in other ways.

As also shown in FIG. 17A, a force sensor 1744 may be at least partially attached to the haptic engine 1700 and configured to sense a force applied to the module (e.g., a force applied to a user interaction surface of the button 1722, which force is received by the shuttle 1712, the stator 1702, or a housing for the haptic engine 1700). In some embodiments, the force sensor 1744 may include one or more strain sensors 1744a attached to an exterior surface of the second component 1706 of the stator 1702, or to other surfaces of the stator 1702. In some embodiments, the strain sensors 1744a may be formed on a flex circuit 1746, and the flex circuit 1746 may be adhesively bonded or otherwise attached to a surface of the stator 1702. Alternatively, one or more strain sensors may be attached to the flexure 1714a (e.g., at or near a shuttle attachment portion 1732a, 1732b or elsewhere), or to another component. When a user applies a force to the button 1722 (e.g., presses the button 1722), the strain sensor(s) 1744a may flex. Outputs of the strain sensor(s) 1744a may change in a manner that is related to the amount or location of the force applied to the button 1722. In alternative embodiments, the strain sensors 1744a may be positioned elsewhere on the haptic engine 1700, or on a housing of the haptic engine 1700. In further alternative embodiments, the force sensor 1744 may additionally or alternatively include a capacitive force sensor or other type of force sensor, such as a capacitive force sensor having first and second spaced apart electrodes mounted in a gap between the first component 1704 of the stator 1702 and the shuttle 1712, or a capacitive force sensor having first and second spaced apart electrodes mounted between the button 1722 and the first component 1704 of the stator 1702.

In some embodiments, the flex circuit 1746 may include a circuit such as the circuit 1318 described with reference to FIG. 13A. In some embodiments, the flex circuit 1746 may be electrically coupled to an off-module processor, controller, or other circuit. In some embodiments, the flex circuit 1746, or another flex circuit that may or may not be coupled to the flex circuit 1746, may be electrically coupled to the coils 1742.

As shown in FIGS. 17A & 17C, the button 1722 may have a user interaction surface that extends parallel (or substantially parallel) to the axis 1720 along which the shuttle 1712 translates. In alternative embodiments, the button 1722 may have a user interaction surface that extends transverse to (e.g., intersects) the axis 1720 along which the shuttle 1712 translates, and the attachment member 1730 may extend through or around the flexure 1714a and fourth housing component 1710 of the stator 1702. In the latter embodiments, the button 1722 may move in and out with respect to an exterior surface of a housing, instead of translating along an exterior surface of the housing.

Figure 18:
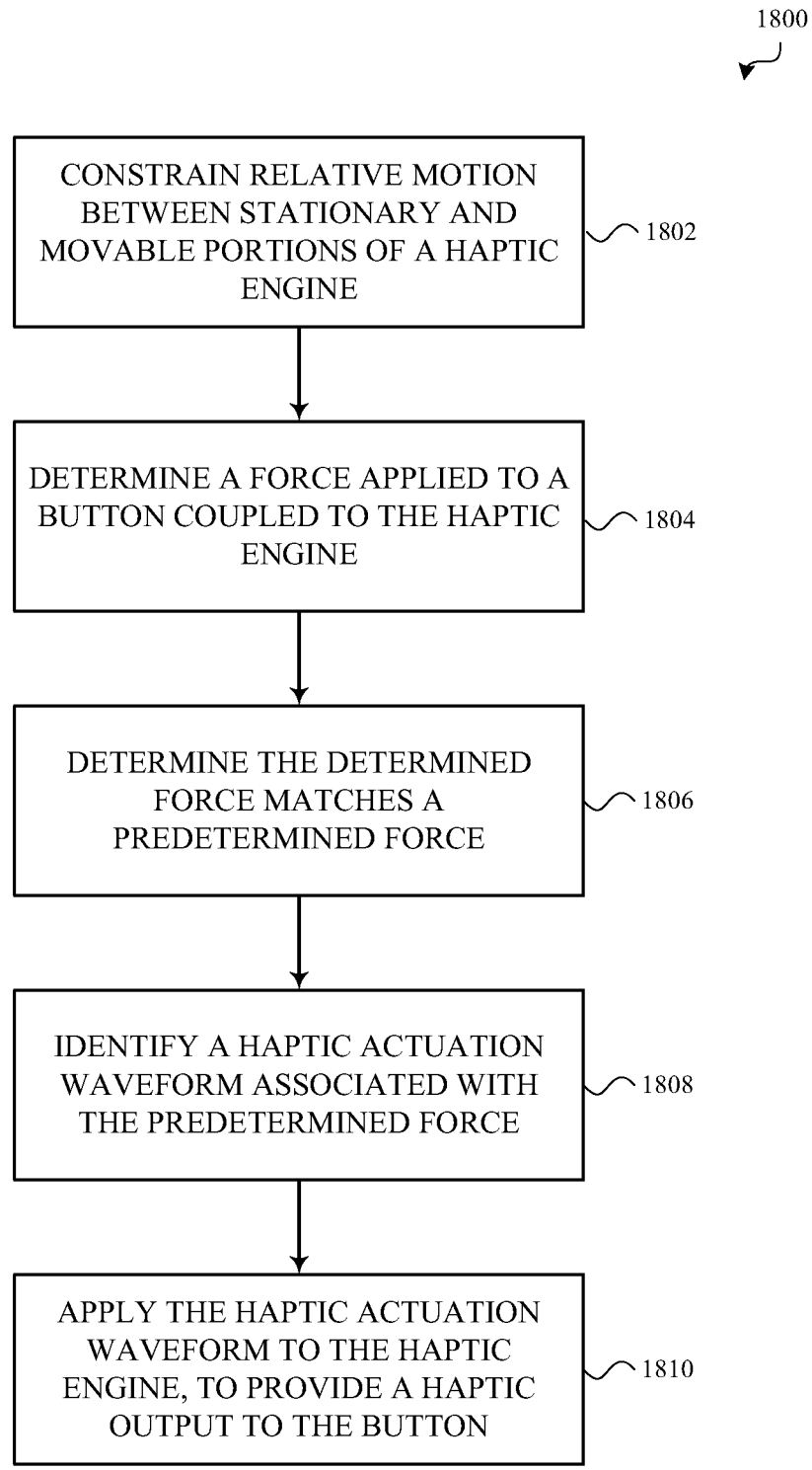
FIG. 18 illustrates an example method of providing a haptic response to a user.

FIG. 18 illustrates an example method 1800 of providing a haptic response to a user. The method 1800 may be performed by, or using, any of the modules or button assemblies described herein. The method 1800 may also be performed by, or using, other modules or button assemblies.

At block 1802, the method 1800 may include constraining relative motion between a stationary portion and a movable portion of a haptic engine, to bias the movable portion toward a rest position in which the movable portion is separated from the stationary portion by a gap, and to constrain closure of the gap. The movable portion may be mechanically coupled to a button. In some embodiments, the relative motion between the stationary portion and the movable portion may be constrained to a pivot of the movable portion with respect to the stationary portion. In other embodiments, the relative motion between the stationary portion and the movable portion is constrained to translation of the movable portion along an axis. The operation(s) at block 1802 may be performed by one or more of the constrains described herein.

At block 1804, the method 1800 may include determining a force applied to the button using a force sensor (e.g., a capacitive force sensor, a strain sensor, a tactile switch, and so on). The operation(s) at block 1804 may be performed by one or more of the force sensors described herein.

At block 1806, the method 1800 may include determining the determined force matches a predetermined force. The operation(s) at block 1806 may be performed by one or more of the on-module or off-module circuits described herein.

At block 1808, the method 1800 may include identifying a haptic actuation waveform associated with the predetermined force. In some embodiments, different haptic actuation waveforms may have different amplitudes, different frequencies, and/or different patterns. The operation(s) at block 1808 may be performed by one or more of the on-module or off-module circuits described herein.

At block 1810, the method 1800 may include applying the haptic actuation waveform to the haptic engine. The operation(s) at block 1810 may be performed by one or more of the on-module or off-module circuits described herein.

In some embodiments of the method 1800, the force sensor may include at least two force sensing elements positioned at different locations relative to a user interaction surface of the button, and the force may be determined using different outputs of the different force sensing elements, as described, for example, with reference to FIGS. 13A 14A. In some of these embodiments, the determined force may include a determined amount of force, and the predetermined force may include a predetermined amount of force. Additionally or alternatively, the determined force may include a determined force location, and the predetermined force may include a predetermined force location.

In some embodiments of the method 1800, the determined force may include a determined force pattern, and the predetermined force may include a predetermined force pattern.

In some embodiments of the method 1800, the relative motion between the stationary portion and the movable portion may be constrained to translation along an axis transverse to a direction of the force applied to the button. Alternatively, the relative motion may be constrained to translation along an axis parallel to the direction of the force applied to the button.

In some embodiments, the method 1800 may include measuring the gap, between the movable and stationary portions of the haptic engine, and controlling the gap's width in a closed loop fashion (e.g., to provide haptic output, or to maintain the gap width when no haptic output is being provided). The gap width may be measured capacitively, optically, or by other means.

In some embodiments, the method 1800 may not include the operations at blocks 1808 and 1810, and may instead include the operation of taking an action associated with the predetermined force, without providing a haptic output. For example, the method 1800 may include providing an input to an application or utility running on a device, altering the output of a user interface (e.g., a display) of the device, providing an audible notification, etc.

Figure 19:
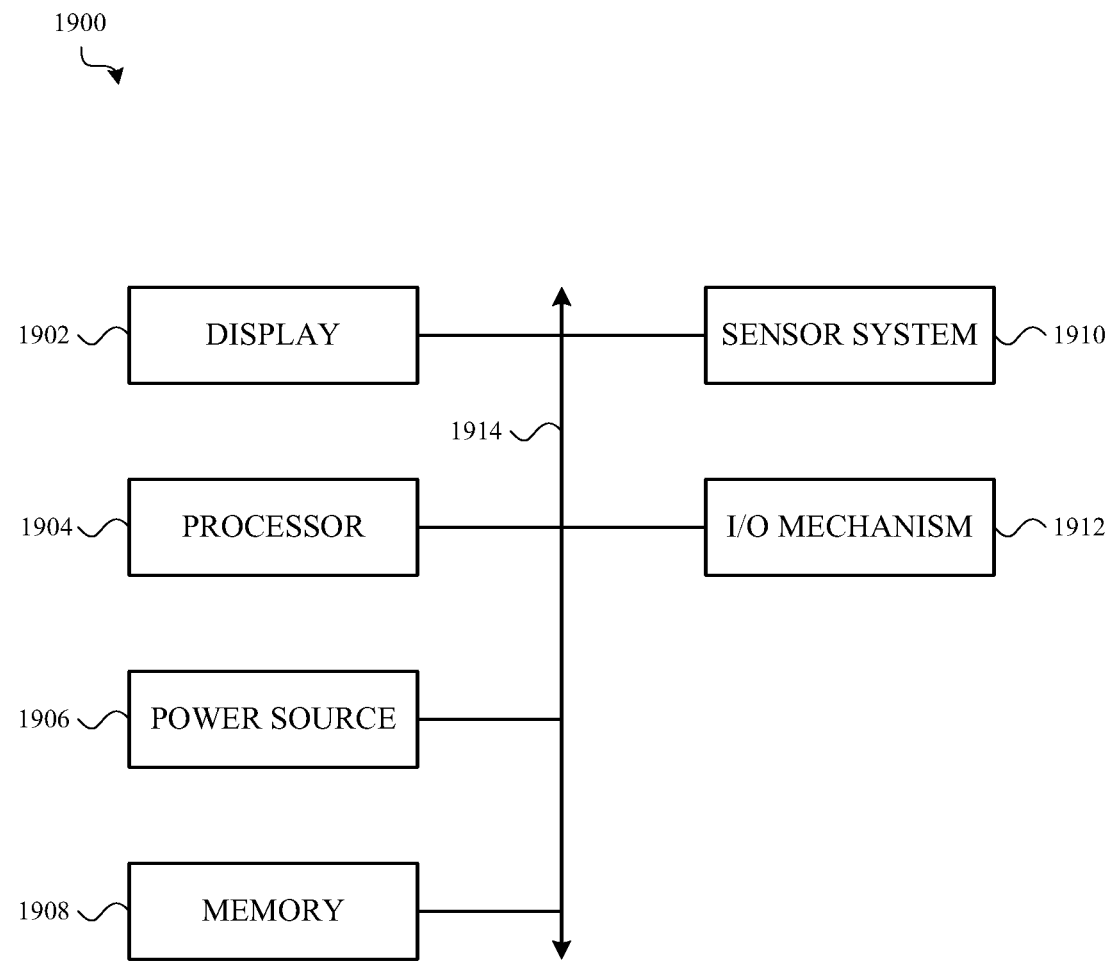
FIG. 19 shows a sample electrical block diagram of an electronic device.

FIG. 19 shows a sample electrical block diagram of an electronic device 1900, which may be the electronic device described with reference to FIGS. 1A-1C. The electronic device 1900 may include a display 1902 (e.g., a light-emitting display), a processor 1904, a power source 1906, a memory 1908 or storage device, a sensor system 1910, and an input/output (I/O) mechanism 1912 (e.g., an input/output device and/or input/output port). The processor 1904 may control some or all of the operations of the electronic device 1900. The processor 1904 may communicate, either directly or indirectly, with substantially all of the components of the electronic device 1900. For example, a system bus or other communication mechanism 1914 may provide communication between the processor 1904, the power source 1906, the memory 1908, the sensor system 1910, and/or the input/output mechanism 1912.

The processor 1904 may be implemented as any electronic device capable of processing, receiving, or transmitting data or instructions. For example, the processor 1904 may be a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements. In some embodiments, the processor 1904 may include or be an example of the circuit 1318 described with reference to FIG. 13A.

In some embodiments, the components of the electronic device 1900 may be controlled by multiple processors. For example, select components of the electronic device 1900 may be controlled by a first processor and other components of the electronic device 1900 may be controlled by a second processor, where the first and second processors may or may not be in communication with each other.

The power source 1906 may be implemented with any device capable of providing energy to the electronic device 1900. For example, the power source 1906 may be one or more batteries or rechargeable batteries. Additionally or alternatively, the power source 1906 may be a power connector or power cord that connects the electronic device 1900 to another power source, such as a wall outlet.

The memory 1908 may store electronic data that may be used by the electronic device 1900. For example, the memory 1908 may store electrical data or content such as, for example, audio and video files, documents and applications, device settings and user preferences, timing signals, control signals, data structures or databases, image data, or focus settings. The memory 1908 may be configured as any type of memory. By way of example only, the memory 1908 may be implemented as random access memory, read-only memory, Flash memory, removable memory, other types of storage elements, or combinations of such devices.

The electronic device 1900 may also include one or more sensors defining the sensor system 1910. The sensors may be positioned substantially anywhere on the electronic device 1900. The sensor(s) may be configured to sense substantially any type of characteristic, such as but not limited to, touch, force, pressure, light, heat, movement, relative motion, biometric data, and so on. For example, the sensor system 1910 may include a touch sensor, a force sensor, a heat sensor, a position sensor, a light or optical sensor, an accelerometer, a pressure sensor (e.g., a pressure transducer), a gyroscope, a magnetometer, a health monitoring sensor, and so on. Additionally, the one or more sensors may utilize any suitable sensing technology, including, but not limited to, capacitive, ultrasonic, resistive, optical, ultrasound, piezoelectric, and thermal sensing technology. In some embodiments, the sensor(s) may include the force sensor in any of the modules or button assemblies described herein.

The I/O mechanism 1912 may transmit and/or receive data from a user or another electronic device. An I/O device may include a display, a touch sensing input surface such as a track pad, one or more buttons (e.g., a graphical user interface "home" button, or one of the buttons described herein), one or more cameras, one or more microphones or speakers, one or more ports such as a microphone port, and/or a keyboard. Additionally or alternatively, an I/O device or port may transmit electronic signals via a communications network, such as a wireless and/or wired network connection. Examples of wireless and wired network connections include, but are not limited to, cellular, Wi-Fi, Bluetooth, IR, and Ethernet connections. The I/O mechanism 1912 may also provide feedback (e.g., a haptic output) to a user, and may include the haptic engine of any of the modules or button assemblies described herein.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. A module, comprising:
   a permanent magnet biased electromagnetic haptic engine, comprising:
     a stator defining a channel; and
     a shuttle configured to move within the channel;
   a constraint coupled to the stator and the shuttle; and
   a force sensor at least partially attached to the permanent magnet biased electromagnetic haptic engine and configured to sense a force applied to the module; wherein:
   the constraint is configured to constrain closure of a gap between the stator and the shuttle and bias the shuttle toward a rest position in which the shuttle is separated from the stator by the gap; and
   the constraint is attached to a first side of the stator that faces away from the channel, and unattached to a second side of the stator that faces the shuttle, the first side opposite the second side.

2. The module of claim 1, wherein the stator comprises:
   permanent magnets positioned on first opposite sides of the shuttle; and
   coils positioned on at least one side of the shuttle.

3. The module of claim 1, further comprising:
   a button having a user interaction surface connected to a button attachment member; wherein:
   the user interaction surface extends parallel to an axis along which the shuttle translates; and
   the button attachment member extends transverse to the axis along which the shuttle translates.

4. The module of claim 1, further comprising:
   a button having a user interaction surface connected to a button attachment member; wherein:
   the user interaction surface extends transverse to an axis along which the shuttle translates; and
   the button attachment member extends parallel to the axis along which the shuttle translates.

5. A module, comprising:
   a haptic engine having a stationary portion and a movable portion, the movable portion configured to move linearly, when the haptic engine is stimulated by an electrical signal, to provide a haptic output;
   a force sensor at least partially attached to the haptic engine and configured to sense a force applied to the module; and
   a constraint configured to constrain movement of the movable portion relative to the stationary portion and bias the movable portion toward a rest position in which the movable portion is separated from the stationary portion by a gap; wherein,
   the constraint is unattached to a first side of the movable portion, which first side is transverse to a direction of the linear movement of the movable portion.

6. The module of claim 5, wherein:
the constraint comprises a flexure extending in a direction transverse to the direction of the linear movement of the movable portion;
the flexure connects at least one side of the movable portion, other than the first side, to the stationary portion.

7. The module of claim 5, wherein the constraint is configured to provide a first stiffness opposing the linear movement of the movable portion.

8. The module of claim 7, further comprising:
a button attached to the movable portion of the haptic engine; wherein:
the force applied to the module comprises a button press; and
the constraint is configured to provide a second stiffness opposing the force applied to the button.

9. The module of claim 5, further comprising:
a button attached to the movable portion of the haptic engine; wherein:
the force applied to the module comprises a button press; and
the movable portion is configured to move transverse to a direction of the button press when the haptic engine is stimulated by the electrical signal.

10. The module of claim 5, further comprising:
a button attached to the movable portion of the haptic engine; wherein:
the force applied to the module comprises a button press; and
the movable portion is configured to move parallel to a direction of the button press when the haptic engine is stimulated by the electrical signal.

11. The module of claim 5, wherein:
the force sensor is configured to produce an output signal in response to sensing the force applied to the module; and
the electrical signal is received by the haptic engine in response to the output signal produced by the force sensor.

12. The module of claim 5, wherein the constraint comprises a metal flexure.

13. The module of claim 5, wherein:
the force sensor comprises a strain sensor; and
the strain sensor is attached to and flexes with the stationary portion.

14. The module of claim 5, wherein:
the force sensor comprises a capacitive force sensor; and
the capacitive force sensor comprises:
a first electrode attached to the stationary portion; and
a second electrode attached to the movable portion.

15. A method of providing a haptic response to a user, comprising:
constraining relative motion between a stationary portion and a movable portion of a haptic engine, to bias the movable portion toward a rest position in which the movable portion is separated from the stationary portion by a gap, and to constrain closure of the gap;
determining a force applied to a button using a force sensor, the button mechanically coupled to the movable portion, and the force sensor mechanically coupled to the stationary portion;
determining the determined force matches a predetermined force;
identifying a haptic actuation waveform associated with the predetermined force; and
applying the haptic actuation waveform to the haptic engine; wherein:
the relative motion between the stationary portion and the movable portion is constrained to translation of the movable portion along an axis.

16. The method of claim 15, wherein:
the force sensor comprises at least two force sensing elements positioned at different locations relative to a user interaction surface of the button;
the force is determined using different outputs of the at least two force sensing elements;
determining the force comprises determining an amount of force; and
determining the determined force matches the predetermined force comprises determining the determined amount of force matches a predetermined amount of force.

17. The method of claim 15, wherein:
the force sensor comprises at least two force sensing elements positioned at different locations relative to a user interaction surface of the button;
the force is determined using different outputs of the at least two force sensing elements;
determining the force comprises determining a force location; and
determining the determined force matches the predetermined force comprises determining the determined force location matches a predetermined force location.

18. The method of claim 15, wherein:
determining the force comprises determining a force pattern; and
determining the determined force matches the predetermined force comprises determining the determined force pattern matches a predetermined force pattern.

19. The method of claim 15, wherein the axis is transverse to a direction of the force applied to the button.

20. The method of claim 15, wherein the axis is parallel to a direction of the force applied to the button.

* * * * *